(12) United States Patent
Oikawa

(10) Patent No.: US 9,784,800 B2
(45) Date of Patent: Oct. 10, 2017

(54) INSPECTION CIRCUIT FOR MAGNETIC FIELD DETECTOR, AND INSPECTION METHOD FOR THE SAME

(71) Applicant: FUJIKURA LTD., Koto-ku, Tokyo (JP)

(72) Inventor: Yasushi Oikawa, Sakura (JP)

(73) Assignee: FUJIKURA LTD., Koto-ku, Tokyo (JP)

( * ) Notice: Subject to any disclaimer, the term of this patent is extended or adjusted under 35 U.S.C. 154(b) by 203 days.

(21) Appl. No.: 14/890,261

(22) PCT Filed: Apr. 28, 2014

(86) PCT No.: PCT/JP2014/061866
§ 371 (c)(1),
(2) Date: Nov. 10, 2015

(87) PCT Pub. No.: WO2014/185263
PCT Pub. Date: Nov. 20, 2014

(65) Prior Publication Data
US 2016/0109533 A1  Apr. 21, 2016

(30) Foreign Application Priority Data
May 13, 2013 (JP) .................................. 2013-101240

(51) Int. Cl.
*G01R 33/04* (2006.01)
(52) U.S. Cl.
CPC .................................... *G01R 33/04* (2013.01)
(58) Field of Classification Search
CPC .. G01R 33/04; G01R 33/045; G01R 33/0502; G01R 33/063; G01R 33/0035;
(Continued)

(56) References Cited

U.S. PATENT DOCUMENTS 4,303,886 A * 12/1981 Rhodes .................. G01R 33/04
324/255
6,380,735 B1    4/2002 Kawakami
(Continued)

FOREIGN PATENT DOCUMENTS

JP    2001-221839 A    8/2001
JP    2001-330655 A    11/2001
(Continued)

OTHER PUBLICATIONS

English Machine Translation of Takatsuji JP 2007-163424, Jun. 2007.*
(Continued)

*Primary Examiner* — Tung X Nguyen
*Assistant Examiner* — Lee Rodak
(74) *Attorney, Agent, or Firm* — Sughrue Mion, PLLC

(57) ABSTRACT

An inspection circuit serves as a pseudo circuit of a flux gate-type magnetic element having an excitation coil and a detection coil and inspects a magnetic field detector that detects a magnetic field based on an output of the magnetic element when detecting an intensity of a stationary magnetic field applied to the magnetic element based on a time-resolved magnetic balance type. The magnetic field detector includes: an excitation signal generation unit, a detection signal comparison unit, a feedback signal conversion unit, a feedback signal adjustment unit, a data signal conversion unit, and an excitation signal adjustment unit.

16 Claims, 15 Drawing Sheets

(58) Field of Classification Search
CPC ............ G01R 33/0041; G01R 33/2829; G01R 33/0023; G01R 33/028; G01R 33/0283; G01R 33/025; G01R 33/0017; G01R 33/1215; G01R 33/00; G01R 35/00; G01R 15/185; G01R 29/0878
USPC .................................................. 324/200–263
See application file for complete search history.

(56) References Cited

U.S. PATENT DOCUMENTS

| | | | |
|---|---|---|---|
| 9,671,484 B2 * | 6/2017 | Youm .................... | G01R 35/00 |
| 2007/0057669 A1 * | 3/2007 | Kobayashi ............. | G01R 33/04 |
| | | | 324/253 |
| 2013/0009659 A1 * | 1/2013 | Liu ........................ | G01R 35/00 |
| | | | 324/756.02 |
| 2013/0038321 A1 * | 2/2013 | Suzuki ................... | G01R 35/00 |
| | | | 324/224 |

FOREIGN PATENT DOCUMENTS

| | | | | |
|---|---|---|---|---|
| JP | 2006-296829 A | | 11/2006 | |
| JP | 2007163424 | * | 6/2007 | ............ G01R 33/04 |
| JP | 2013-36941 A | | 2/2013 | |

OTHER PUBLICATIONS

Communication dated Aug. 30, 2016, from the Japanese Patent Office in counterpart Japanese application No. 2013-101240.

* cited by examiner

INSPECTION CIRCUIT FOR MAGNETIC FIELD DETECTOR, AND INSPECTION METHOD FOR THE SAME

CROSS REFERENCE TO RELATED APPLICATIONS

This application is a National Stage of International Application No. PCT/JP2014/061866 filed Apr. 28, 2014, claiming priority based on Japanese Patent Application No. 2013-101240, filed May 13, 2013, the contents of all of which are incorporated herein by reference in their entirety.

TECHNICAL FIELD

The present invention relates to an inspection circuit for a magnetic field detector or the like that measures a current using a magnetic-balanced flux-gate type magnetic element, and an inspection method for the same.

BACKGROUND ART

Generally, flux-gate type magnetic elements have high sensitivity when detecting a magnetic field and are capable of being reduced in size, as compared to Hall elements or magneto-resistive elements which are magnetic elements that detect similar magnetism. For this reason, flux-gate type magnetic elements are used in a magnetic field detector or the like such as a portable electronic device. Particularly, when magnetic balance type magnetic elements are used, it is possible to improve the accuracy of measurement.

In the magnetic balance type flux-gate type magnetic element, a time interval between detection signals is converted into time information indicating a time interval between PWM signals or the like, a time indicated by the time information is further converted into a DC voltage corresponding to a time length, and a feedback loop in which the DC voltage is set to a feedback signal is formed.

Therefore, a DC voltage obtained from a detection signal corresponding to a magnetic field to be applied is changed to an output signal indicating measurement results of the applied magnetic field. For this reason, it is necessary to inspect response characteristics in an internal circuit of a magnetic field detector.

That is, an output signal in a zero magnetic field is measured, thereby allowing an offset in the internal circuit which is superimposed on the output signal to be inspected. Here, when the response characteristics of the magnetic field detector are normal, a numerical value (within a range of a normal value in a predetermined specification) indicating a magnetic field of 0 is output as the output signal during the application of the zero magnetic field to the magnetic element. On the other hand, when there is abnormality in the response characteristics of the internal circuit of the magnetic field detector, the output signal is output with a deviation from a numerical value indicating a magnetic field of 0 during the application of the zero magnetic field to the magnetic element.

In addition, a magnetic field changing in a detectable magnetic field range shown in the specification of the magnetic field detector is applied, and an output signal in that case is measured, thereby allowing the linearity of a change in a time interval between detection signals with respect to a change in a magnetic field to be inspected. Here, when the response characteristics of the magnetic field detector are normal, a change in the detection signal has a linearity within the range of a normal value in a predetermined specification with respect to a change in a magnetic field. On the other hand, when there is abnormality in the response characteristics of the internal circuit of the magnetic field detector, a change in the detection signal does not have linearity with respect to a change in a magnetic field.

As described above, an offset in a zero magnetic field and the linearity of the output signal with respect to a change in a magnetic field are measured in the shipping inspection of the magnetic field detector, thereby allowing the quality determination of the magnetic field detector to be performed.

The zero magnetic field and a stationary magnetic field changing in a predetermined range are applied to the magnetic field detector with a high level of accuracy. For this reason, the magnetic field detector is inserted into a magnetic field generator that generates the stationary magnetic field, and the magnetic field detector is inspected by applying a predetermined magnetic field (see, for example, PTL 1).

CITATION LIST

Patent Literature

[PTL 1] Japanese Unexamined Patent Application, First Publication No. 2013-36941

SUMMARY OF INVENTION

Technical Problem

As described above, when an offset of the output signal in a zero magnetic field and linearity between a change in a magnetic field and the output signal are measured, the magnetic element is connected to the magnetic field detector, and inspection in the magnetic field generator is performed in this connected state.

When a stationary magnetic field is applied to the magnetic element, a high-priced magnetic field generator is used, which results in an increase in costs of an inspection process and an increase in manufacturing costs of the magnetic field detector.

In addition, in the magnetic field generator, since the environment of a stationary magnetic field is provided, inspection efficiency is determined depending on the size of the magnetic field generator and the number of magnetic field detectors capable of performing measurement at a time.

Further, since inspection is performed by connecting the magnetic element, characteristics for a physical property of the connected magnetic element is reflected in the detection signal, and the characteristics influence the output signal of the magnetic field detector, which results in the incapability of the quality of the magnetic field detector being accurately determined. In a case of driving based on a magnetic proportion FG type, a pseudo signal of a pickup signal formed by a waveform generator is input from the input terminal of the pickup signal, thereby allowing pseudo sensor output characteristics to be evaluated. On the other hand, in a case of a magnetic balanced FG type, it is necessary to return an FB signal, and thus there is a problem in that it is difficult to realize a stable feedback convergence state using the waveform generator. In addition, due to an FB system different from that in a case where the magnetic element is connected to the magnetic field detector, there is a problem in that it is difficult to realize the same transient response as that in a case where the magnetic element is connected by using the waveform generator.

The present invention is contrived in view of such circumstances, and an object thereof is provide an inspection circuit for a magnetic field detector and an inspection method for the same which are capable of inspecting the characteristics of an internal circuit of a magnetic field detector without using a magnetic field generator and without reflecting the influence of characteristics for a physical property of a magnetic element when the inspection of an offset of an output signal in a zero magnetic field and linearity for a change of a magnetic field in a detectable range in a specification is performed on a magnetic field detector.

Solution to Problem

According to a first aspect of the present invention, an inspection circuit serves as a pseudo circuit of a flux-gate type magnetic element having an exciting coil and a detection coil, and inspects a magnetic field detector that detects a magnetic field based on an output of the magnetic element when detecting an intensity of a stationary magnetic field applied to the magnetic element based on a time-resolution magnetic balance type. The magnetic field detector includes an excitation signal generation unit that generates an alternating signal, a detection signal comparison unit that detects detection signals of a positive voltage or a negative voltage which are generated in the detection coil by an induced electromotive force when a current direction of an excitation current which is applied to the exciting coil is switched, a feedback signal conversion unit that converts a time width between the detection signals of a positive voltage and a negative voltage into voltage information, a feedback signal adjustment unit that generates a feedback signal for generating a magnetic field that cancels out the stationary magnetic field which is applied to the magnetic element from the voltage information, a data signal conversion unit that outputs the feedback signal as a data signal indicating a magnetic field intensity, and an excitation signal adjustment unit that generates an alternating current from the alternating signal, and generates the excitation current which is applied to the exciting coil based on the alternating current. The inspection circuit includes an alternating signal adjustment unit, connected to an output of the excitation signal adjustment unit, which inputs the excitation current, as a pseudo signal of the detection signal, to an input terminal of the detection signal comparison unit after an intensity of the excitation current which is output by the excitation signal adjustment unit is adjusted.

According to a second aspect of the present invention, in the inspection circuit for a magnetic field detector of the first aspect, the alternating signal adjustment unit may be constituted by a first resistor having the same resistance value as that of the exciting coil.

According to a third aspect of the present invention, in the inspection circuit for a magnetic field detector of the first aspect, the excitation signal adjustment unit may generate an excitation signal which is applied to the exciting coil by superimposing the feedback signal, based on the detection signal or the pseudo signal, on the alternating current generated from the alternating signal.

According to a fourth aspect of the present invention, in the inspection circuit for a magnetic field detector of the first aspect, the feedback signal adjustment unit may include a terminal for generating, from the voltage information, the feedback signal for generating the magnetic field that cancels out the stationary magnetic field which is applied to the magnetic element, and inputting the feedback signal to the feedback coil, and the inspection circuit may further include a feedback signal termination unit that terminates an output of the feedback signal adjustment unit.

According to a fifth aspect of the present invention, in the inspection circuit for a magnetic field detector of the fourth aspect, the feedback signal termination unit may be constituted by a second resistor having the same resistance value as that of the feedback coil.

According to a sixth aspect of the present invention, in the inspection circuit for a magnetic field detector of any one of the first aspect to the fifth aspect, the inspection circuit may further include a feedback signal addition unit that adds a constant current obtained by simulating the stationary magnetic field to the feedback signal and outputs the constant current to the excitation signal adjustment unit.

According to a seventh aspect of the present invention, in the inspection circuit for a magnetic field detector of any one of the first aspect to the fifth aspect, the inspection circuit may further include a feedback signal addition unit that adds a constant voltage obtained by simulating the stationary magnetic field to the feedback signal and outputs the constant voltage to the excitation signal generation unit.

According to an eighth aspect of the present invention, an inspection method uses a pseudo circuit of a flux-gate type magnetic element having an exciting coil and a detection coil, and inspects a magnetic field detector that detects a magnetic field based on an output of the magnetic element when detecting an intensity of a stationary magnetic field applied to the magnetic element based on a time-resolution magnetic balance type. The magnetic field detector includes an excitation signal generation unit that generates an alternating signal, a detection signal comparison unit that detects detection signals of a positive voltage or a negative voltage which are generated in the detection coil by an induced electromotive force when a current direction of an excitation current which is applied to the exciting coil is switched, a feedback signal conversion unit that converts a time width between the detection signals of a positive voltage and a negative voltage into voltage information, a feedback signal adjustment unit that generates a feedback signal for generating a magnetic field that cancels out the stationary magnetic field which is applied to the magnetic element from the voltage information, a data signal conversion unit that outputs the feedback signal as a data signal indicating a magnetic field intensity, and an excitation signal adjustment unit that generates an alternating current from the alternating signal, and generates the excitation current which is applied to the exciting coil based on the alternating current. The inspection method includes a step of supplying the excitation current which is output by the excitation signal adjustment unit, to an alternating signal adjustment unit connected to an output of the excitation signal adjustment unit, and a step of inputting the excitation current, as a pseudo signal of the detection signal, to an input terminal of the detection signal comparison unit after an intensity of the excitation current is adjusted by the alternating signal adjustment unit.

Advantageous Effects of Invention

According to each aspect of the present invention, in the inspection of a magnetic field detector using a magnetic-balanced feedback type, an inspection circuit for a magnetic field detector can inspect the characteristics of an internal circuit of a magnetic field detector without using a magnetic field generator and without reflecting the influence of characteristics for a physical property of a magnetic element when the inspection of an offset of an output signal in a zero magnetic field and linearity for a change of a magnetic field in a detectable range in a specification is performed on a magnetic field detector.

DESCRIPTION OF EMBODIMENTS (First Embodiment)

The configuration of a magnetic balance type magnetic field detector using an FG (flux-gate) type magnetic element which is used in an inspection circuit according to a first embodiment will be described below.

Figure 1:
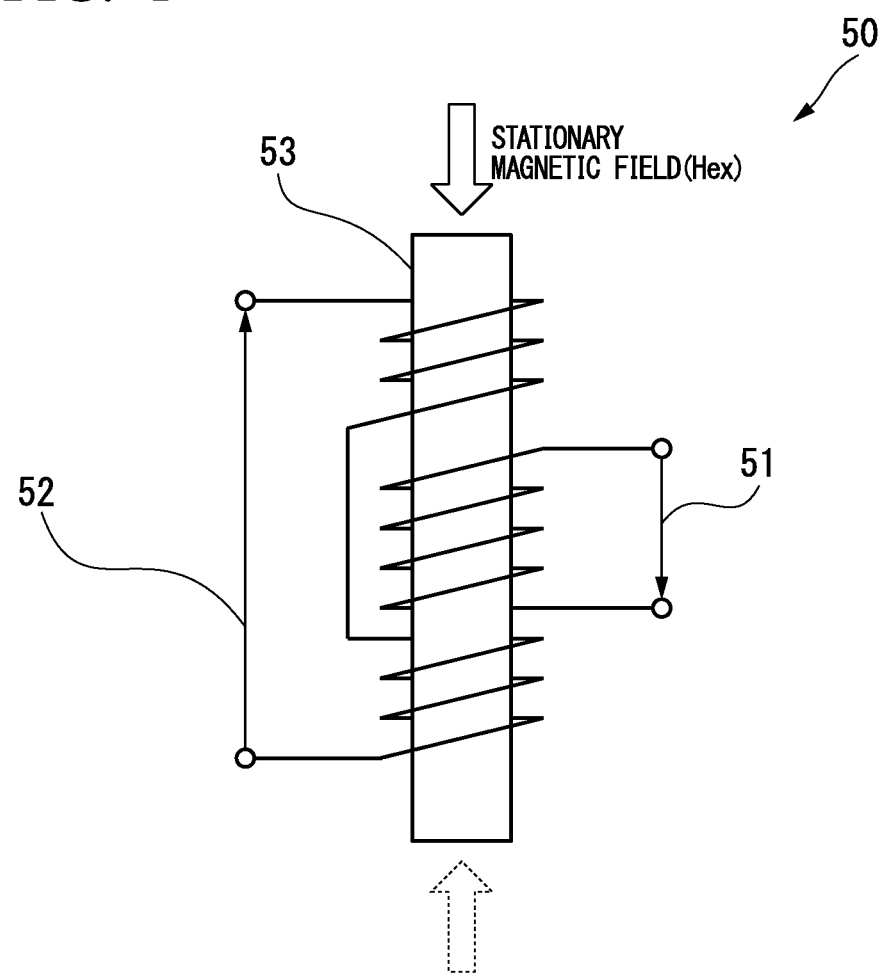
FIG. 1 is a diagram illustrating a configuration example of a time-resolution FG type magnetic element 50 (magnetic field proportion type measurement).

FIG. 1 is a diagram illustrating a configuration example of a time-resolution FG type magnetic element 50 (magnetic field proportion type measurement). As shown in FIG. 1, the FG type magnetic element has an excitation winding and a detection winding wound around the outer circumferential surface of a magnetic substance core 53 made of a material having high magnetic permeability. A region around which the excitation winding is wound is driven by an excitation signal as an exciting coil 52, and a region around which the detection winding is wound outputs a detection signal as a detection coil 51.

Figure 2:
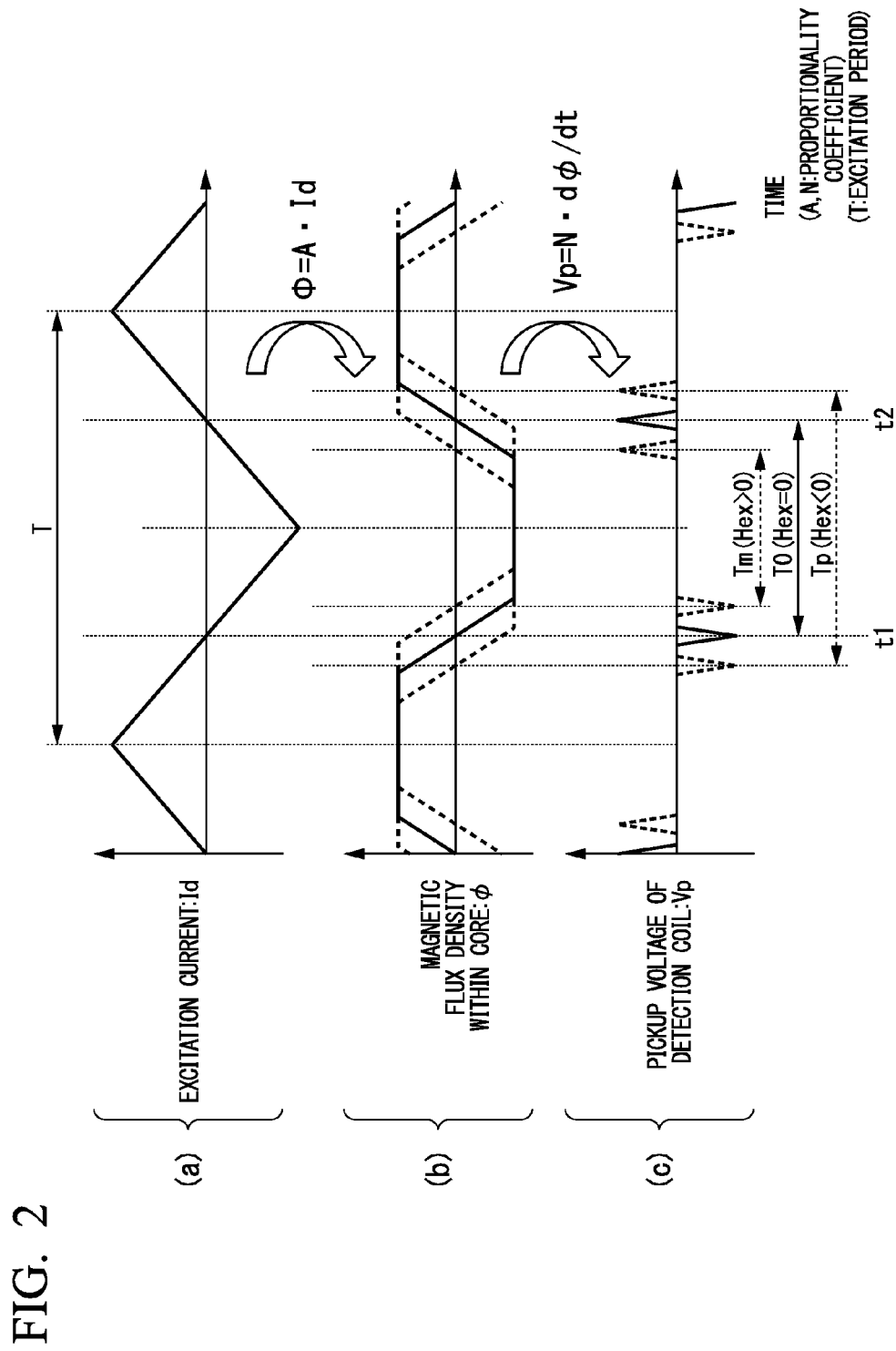
FIG. 2 is a waveform diagram illustrating a principle of magnetism detection in a magnetic field proportion type using the time-resolution FG type magnetic element 50.

FIG. 2 is a waveform diagram illustrating a principle of magnetism detection in a magnetic field proportion type using the time-resolution FG type magnetic element 50. Part (a) of FIG. 2 is a diagram illustrating an excitation current which is supplied to the exciting coil 52 of the magnetic element 50; the vertical axis shows a current value of the excitation current, and the horizontal axis shows time. That is, part (a) of FIG. 2 is a graph illustrating a time change of the current value of the excitation signal which is a triangular wave current supplied to the exciting coil 52. Part (b) of FIG. 2 is a diagram illustrating a magnetic flux density of a magnetic field which is generated within the magnetic substance core 51 by the exciting coil 52 of the magnetic element 50; the vertical axis shows a magnetic flux density, and the horizontal axis shows time. Part (c) of FIG. 2 is a diagram illustrating a voltage value of a pulse which is generated by an induced electromotive force by the detection coil 51 of the magnetic element 50, and the horizontal axis shows time.

In part (a) of FIG. 2, the excitation signal supplied to the exciting coil 52 is a positive and negative alternating signal which is bordered by 0 A. In addition, the period of an excitation signal is T, and the interval of change in a direction in which a current flows when a magnetic field is not applied to the magnetic element 50, that is, the time width of an interval in which a first detection signal and a second detection signal are detected is T/2. Here, part (a) of FIG. 2 shows that by a stationary magnetic field (Hex) being applied to the magnetic element 50, a timing at which the direction of the flow of a current of the triangular wave current signal which is applied to the exciting coil 52 changes deviates depending on the magnitude of the stationary magnetic field applied. That is, the detection signal which is generated in the detection coil 51 based on this triangular wave current signal deviates depending on the stationary magnetic field (Hex), and thus the generation timings of the first detection signal (time t1) and the second detection signal (time t2) deviate temporally.

In addition, part (c) of FIG. 2 is a graph illustrating the time change of detection signals (first detection signal at time t1 and second detection signal at time t2) generated in the detection coil 51 due to an induced electromotive force when the direction of a current flowing to the exciting coil 52 based on the triangular wave current signal of part (a) of FIG. 2, that is, the (positive or negative) polarity of a current changes, in which the vertical axis thereof represents a voltage, and the horizontal axis thereof represents a time. In this case, a reference voltage in part (c) of FIG. 2 is 0 V.

In FIG. 2, a signal of an excitation current Id (hereinafter, referred to as an excitation signal) is applied between the terminals of the exciting coil, as the excitation signal of an alternating current having a constant period, that is, as the excitation signal (that is, triangular wave current signal) having a triangular wave shape as shown in part (b) of FIG. 2. As can be understood from part (c) of FIG. 2, when a difference Td (not shown) between a time width T0 between time t1 of the first detection signal and time t2 of the second detection signal (between detection signals) and a time T/2 which is ½ of the period T of a triangular wave is 0, the stationary magnetic field (Hex) is not applied to the magnetic element 50. When the difference Td is positive (in a case of a time width Tm), the positive stationary magnetic field (Hex>0) is applied.

Thereby, at the time (positive and negative alternating time slot of the excitation current) at which the direction of the excitation current changes, in the case of part (c) of FIG. 2, the detection coil generates a positive and negative pulse (pickup signal, that is, detection signal) based on an induced electromotive force at time t1 and time t2, and a voltage Vp (pickup voltage) of the pulse is set to a detection signal. The detection signal is continuously generated between the terminals of the detection coil as a pulse having voltages of positive and negative polarities, corresponding to the period of the triangular wave current signal.

When the stationary magnetic field Hex passing through a cylindrical space in which each of the exciting coil 52 and the detection coil 51 that circle the magnetic substance core 53 is created is applied to the magnetic element 50, a stationary current corresponding to the stationary magnetic field flows in the exciting coil 52. That is, the stationary current based on the stationary magnetic field mentioned above is superimposed as an offset on the excitation current Id of the excitation signal which is applied to the exciting coil 52.

As a result, the driving state of the exciting coil 52 based on the alternating excitation signal changes due to the offset. That is, the time at which the direction of the flow of the excitation current Id changes varies in a case where the stationary magnetic field Hex is applied and a case where the stationary magnetic field Hex is not applied.

In this case, as shown in part (c) of FIG. 2, when the stationary magnetic field Hex in the same direction as that of a magnetic field generated by the exciting coil 52 is applied (Hex>0), as compared to a case where the stationary magnetic field Hex is not applied (Hex=0), time t1 becomes earlier at a timing at which the direction of the flow of the excitation current Id changes, and time t2 becomes later (time Tm becomes shorter than T/2). On the other hand, when the stationary magnetic field Hex in an opposite direction to that of a magnetic field generated by the exciting coil is applied (Hex<0), as compared to a case where the stationary magnetic field Hex is not applied, time t1 becomes later at a timing at which the direction of the flow of the excitation current Id changes, and time t2 becomes earlier (time Tp becomes longer than T/2).

Thereby, a magnetic flux density $\phi$ in the magnetic substance core changing with a timing at which the direction of the flow of the excitation current Id changes also varies corresponding to the stationary current which is superimposed on the excitation current Id.

When the direction of a magnetic flux changes, an induced electromotive force is generated in the detection coil 51. For example, a detection signal is generated as a pulse of a negative voltage at a timing at which the excitation current Id changes from positive to negative. On the other hand, a detection signal is generated as a pulse of a positive voltage at a timing at which the excitation current Id changes from negative to positive.

Therefore, from the FG type magnetic element, a timing at which the detection signal is output when the stationary magnetic field Hex is not applied is compared with a timing at which the detection signal is output when the stationary magnetic field Hex is applied, thereby allowing the magnitude of the stationary magnetic field Hex to be measured indirectly. That is, when the stationary magnetic field Hex is applied, a specific stationary current flows to a driving coil. Therefore, a constant offset is superimposed on the excitation signal, and a time interval between pulsed detection signals of a negative voltage and a positive voltage changes.

Therefore, a magnetism detector using an FG-type magnetic element measures the intensity of the stationary magnetic field Hex applied from the outside by measuring a time interval at which the pulsed detection signals of a negative voltage and a positive voltage are generated.

Here, the maximum value of the excitation current Id which is applied to the exciting coil 52 is set to a value for which a magnetic field having more than the saturation magnetic flux density of the magnetic substance core is generated. Thereby, an external magnetic field value and a magnetization state within the magnetic substance core are set to be in 1 state, and thus it is possible to suppress the generation of hysteresis caused by such a magnetization state. As a result, the measurement magnetic field range of the magnetic element is determined from the time of one period of the excitation signal, and time change (hereinafter, referred to as excitation efficiency) corresponding to the current value of the stationary current as an offset due to the application of the stationary magnetic field Hex.

That is, a period from time t0 to time t3 is one period of the excitation signal, and the width of the period is time T. When the stationary magnetic field Hex is not applied (Hex=0), the time from time t1 at which a detection signal of a negative voltage (hereinafter, referred to as a first detection signal) is output to time t2 at which a detection signal of a positive voltage (hereinafter, referred as a second detection signal) is detected becomes equal to the half period of the excitation signal, and thus is set to time T/2.

In addition, when the stationary magnetic field Hex is applied, a time width (hereinafter, measurement time width) until the first detection signal is output and then the second detection signal is detected changes with respect to time T/2. As shown in FIG. 1, when the magnetic flux direction of the stationary magnetic field Hex is the direction of a solid arrow (Hex>0), the direction is the same direction as the direction of a magnetic flux which is generated by the exciting coil, and thus time width Tm becomes shorter than time T/2 (T0>Tm). On the other hand, when the magnetic flux direction of the stationary magnetic field Hex is the direction of a dashed arrow (Hex<0), the direction is an opposite direction to the direction of a magnetic flux which is generated by the exciting coil, and time width Tp becomes longer than time T/2 (Tp>T0). Here, the relation of T0=T/2 is established.

Figure 3:
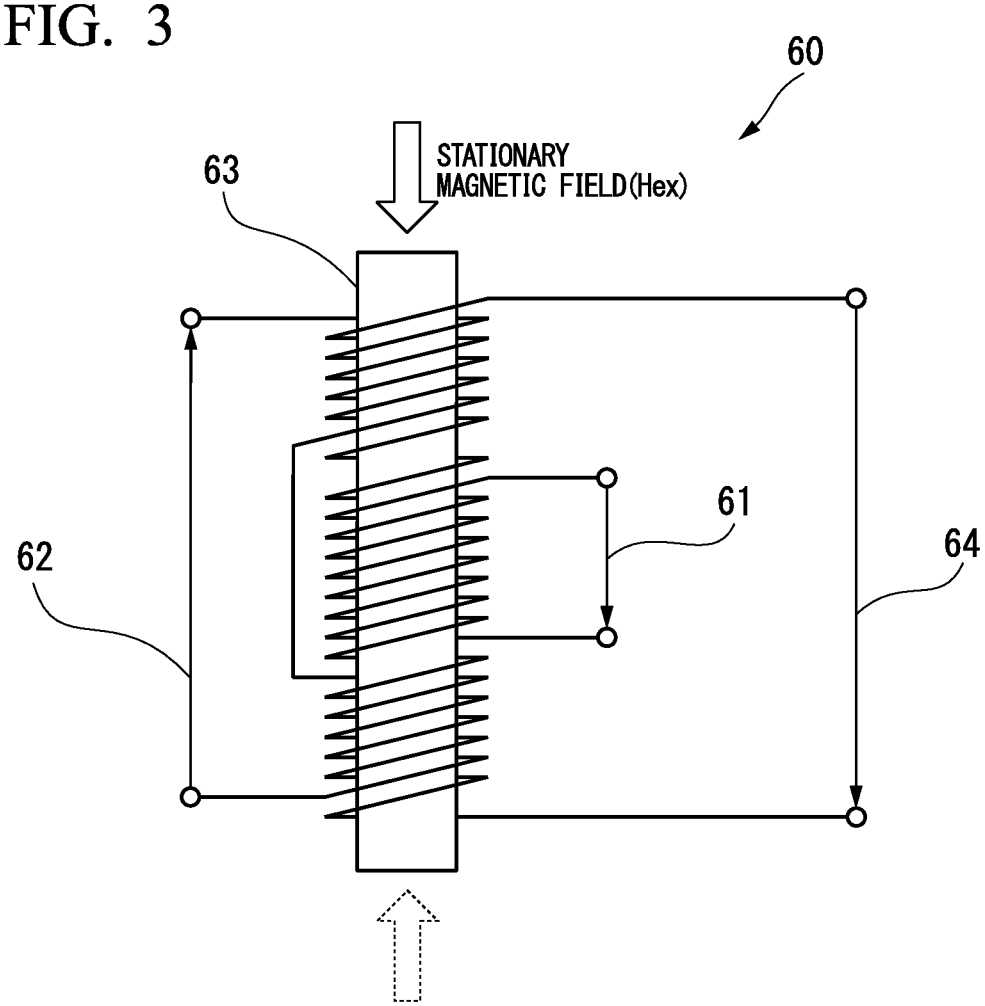
FIG. 3 is a diagram illustrating a configuration example of a time-resolution FG type magnetic element (magnetic field balance type measurement).

Next, FIG. 3 is a diagram illustrating a configuration example of a time-resolution FG type magnetic element (magnetic field balance type measurement). As shown in FIG. 3, unlike the magnetic element 50 of FIG. 1, an FG type magnetic element 60 in magnetic field balance type measurement is configured such that a feedback (hereinafter, FB) winding is wound around the outer circumferential surface of a magnetic substance core 63 formed of a material having high magnetic permeability, in addition to the excitation winding and the detection winding. A region around which the excitation winding is wound is driven by an excitation signal as an exciting coil 62, a region around which the detection winding is wound outputs a detection signal as a detection coil 61, and a region around which the feedback winding is wound is driven by a FB signal as an FB (feedback) coil 64.

Figure 4:
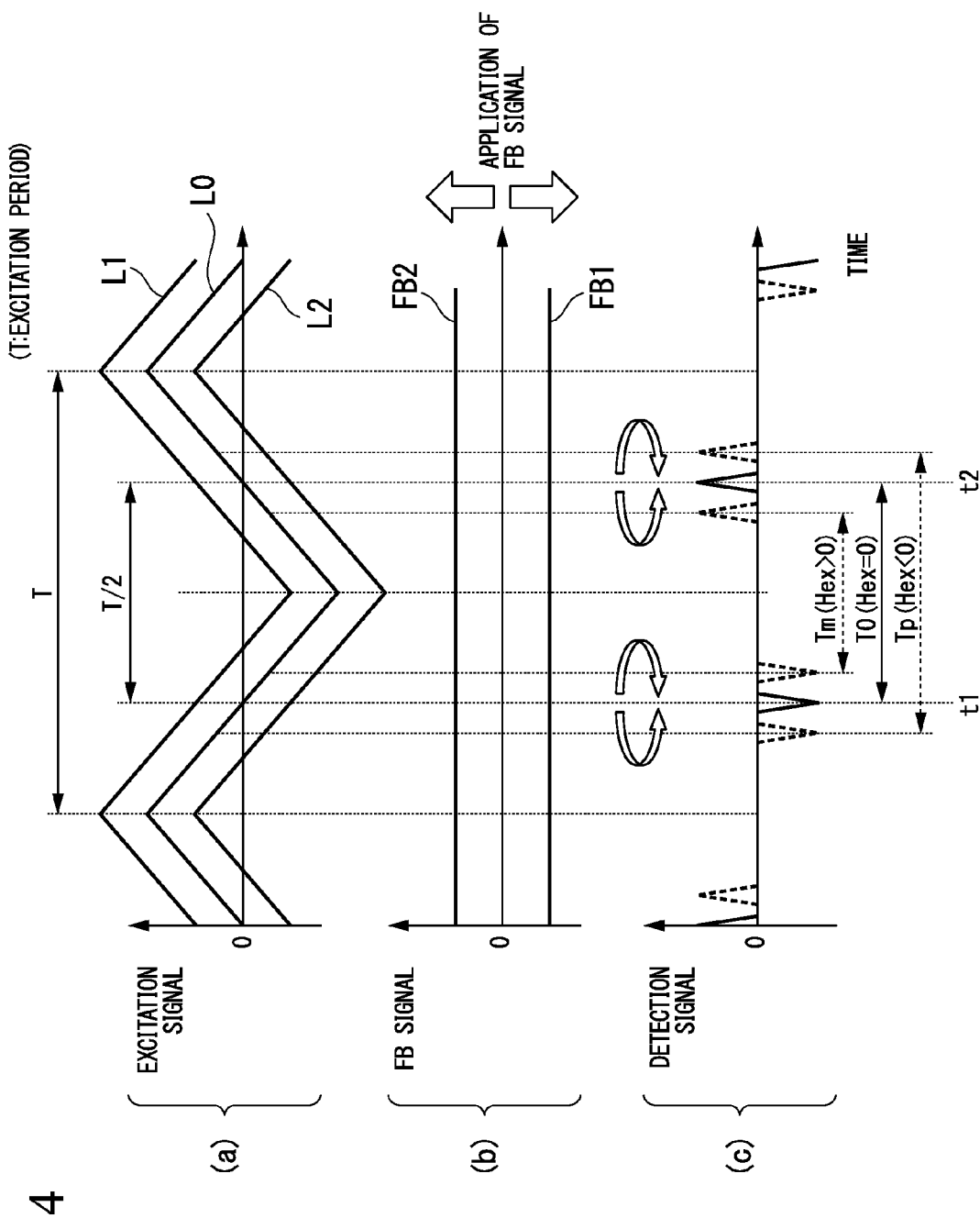
FIG. 4 is a waveform diagram illustrating a principle of magnetism detection in magnetic field balance type measurement using the time-resolution FG type magnetic element.

Next, FIG. 4 is a waveform diagram illustrating a principle of magnetism detection in magnetic field balance type measurement using the time-resolution FG type magnetic element.

Part (a) of FIG. 4 shows an excitation current which is supplied to the exciting coil 62 of the magnetic element; the vertical axis shows a current value of the excitation current, and the horizontal axis shows time. The excitation current is a positive and negative alternating signal bordered by a reference current value of 0 A (zero amperes). Part (b) of FIG. 4 shows an FB signal (that is, feedback signal) which is a current applied to the FB coil 64 of the magnetic element 60; the vertical axis shows a current value of the FB signal, and the horizontal axis shows time. Part (c) of FIG. 4 shows a voltage value of the detection signal which is generated as a pulse based on an induced electromotive force by the detection coil 61 of the magnetic element 60, and the horizontal axis shows time.

In addition, when the stationary magnetic field Hex is applied, a time width (hereinafter, measurement time width) until the first detection signal is output as a detection signal and then the second detection signal is detected changes with respect to a time T/2. Here, as shown in FIG. 3, when the magnetic flux direction of the stationary magnetic field Hex is the direction of a solid arrow (Hex>0), the direction is the same direction as the direction of a magnetic flux which is generated by the exciting coil, and thus time width Tm becomes shorter than time T/2 (T0>Tm). On the other hand, when the magnetic flux direction of the stationary magnetic field Hex is the direction of a dashed arrow (Hex<0), the direction is an opposite direction to the direction of a magnetic flux which is generated by the exciting coil, and time width Tp becomes longer than time T/2 (Tp>T0). Here, the relation of T0=T/2 is established.

As shown in FIG. 4, in the case of magnetic field balance type measurement, a magnetic field that cancels out the stationary magnetic field Hex (stationary magnetic field passing through the magnetic substance core 63) which is applied to the magnetic element 60 is generated by the above FB coil 64. The stationary magnetic field Hex which is applied to the magnetic element 60 is measured from a current value when the magnetic field that cancels out the stationary magnetic field Hex is generated in the FB coil 64.

In a magnetic field balance type, as a coil that generates a magnetic field for canceling out the stationary magnetic field Hex in the magnetic substance core 63, the above FB coil 64 is provided in the magnetic element 60, in addition to the exciting coil 62 and the detection coil 61.

Hereinafter, in this specification, a type in which a magnetic field is measured by applying an FB signal and canceling out the stationary magnetic field Hex within the magnetic substance core 63 will be described as FB coil FB control.

In addition, in the case of magnetic field balance type measurement, similarly to the magnetic field proportion type described previously, a time interval between pulses generated in the detection coil 61 is measured between the positive and negative alternating time slots of the excitation signal which is applied to the exciting coil 62. The FB signal is applied to the FB coil 64 so that time from time t1 at which the measured detection signal of a negative voltage is output to time t2 at which the detection signal of a positive voltage is detected becomes equal to T/2.

For example, in part (c) of FIG. 4, when a time width between time t1 and time t2 is larger than T/2, the stationary magnetic field Hex in a negative direction is applied as shown in part (a) of FIG. 4, and the curve of the excitation signal changes substantially from curve L0 to curve L2. For this reason, since curve L2 of the excitation signal is returned to a position of curve L0 in which the time width between time t1 and time t2 becomes equal to T/2, the FB signal of the current value of line FB2 in part (b) of FIG. 4 is applied to the FB coil 64.

On the other hand, in part (c) of FIG. 4, when the time width between time t1 and time t2 is smaller than T/2, the stationary magnetic field Hex in a positive direction is applied as shown in part (a) of FIG. 4, and the curve of the excitation signal changes substantially from curve L0 to curve L1. For this reason, since curve L1 of the excitation signal is returned to the position of curve L0, the FB signal of the current value of line FB1 in part (b) of FIG. 4 is applied to the FB coil.

The intensity of the stationary magnetic field which is applied to the magnetic element is obtained from the current value of the FB signal applied to the FB coil so that the time width between time t1 and time t2 becomes equal to T/2.

Figure 5:
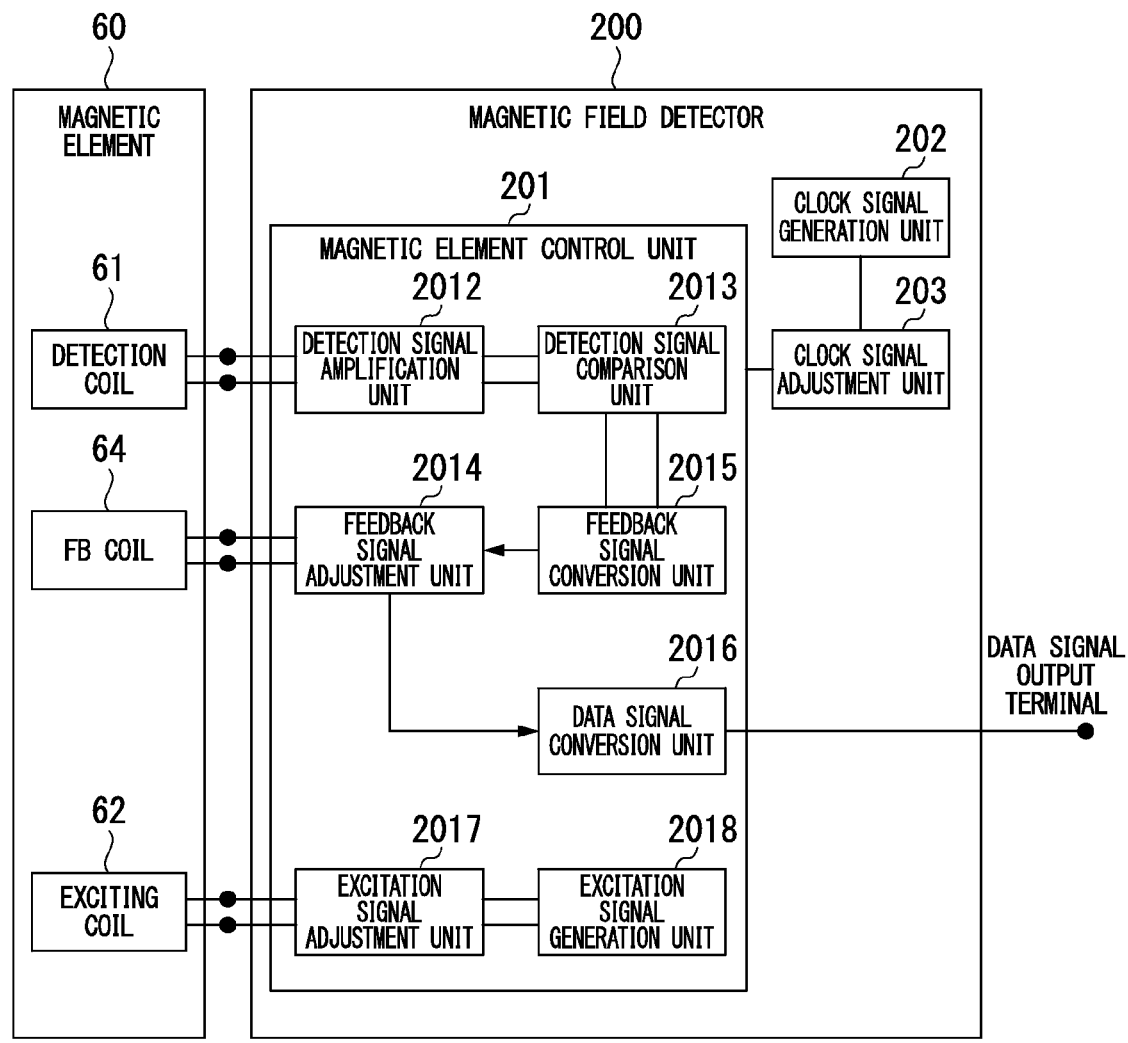
FIG. 5 is a block diagram illustrating a configuration example of a magnetic field detector 200 based on FB coil FB control using a magnetic element 60 of FIG. 3 which serves as an inspection object in which an inspection circuit 10 according to the present embodiment is used.

Next, FIG. 5 is a block diagram illustrating a configuration example of a magnetic field detector 200 based on FB coil FB control using the magnetic element 60 of FIG. 3 which serves as an inspection object in which an inspection circuit 10 in the present embodiment is used. In FIG. 5, the magnetic element 60 is constituted by the detection coil 61, the exciting coil 62, and the FB coil 64.

The magnetic field detector 200 is constituted by a magnetic element control unit 201, a clock signal generation unit 202, and a clock signal adjustment unit 203.

The clock signal generation unit 202 generates a clock of the period T, and outputs the generated clock to the clock signal adjustment unit 203.

The clock signal adjustment unit 203 adjusts the signal level of the clock to be supplied, and outputs the adjusted clock to the magnetic element control unit 201.

The magnetic element control unit 201 includes a detection signal amplification unit 2012, a detection signal comparison unit 2013, a feedback signal adjustment unit 2014, a feedback signal conversion unit 2015, a data signal conversion unit 2016, an excitation signal adjustment unit 2017, and an excitation signal generation unit 2018.

The excitation signal generation unit 2018 generates a triangular wave as the excitation signal shown in part (a) of FIG. 4 from the clock which is supplied from the clock signal adjustment unit 203.

The excitation signal adjustment unit 2017 adjusts the voltage level of the triangular wave signal which is supplied from the excitation signal generation unit 2018, and supplies the adjusted voltage level, as the excitation signal, to the exciting coil 62.

The exciting coil 62 generates a magnetic field corresponding to the triangular wave within the magnetic substance core of the magnetic element 300.

The detection coil 61 generates a pulse at the positive and negative alternating time zone of the excitation signal in the magnetic substance core.

The detection signal amplification unit 2012 amplifies the voltage level of the pulse which is supplied from the detection coil, and outputs the amplified voltage level, as the detection signal, to the detection signal comparison unit 2013.

The detection signal comparison unit 2013 outputs a time waveform indicating the time width of the pulse (detection signal) between time t1 and time t2 to the feedback signal conversion unit 2015, as an output waveform for obtaining a difference between T/2 and the time width.

The feedback signal conversion unit 2015 obtains the current value of the FB signal, supplied to the FB coil, from the output waveform which is supplied from the detection signal comparison unit 2013.

Here, the feedback signal conversion unit 2015 obtains a difference between T/2 and a time indicated by the output waveform, and reads out the current value corresponding to the difference from an FB signal value table which is previously written and stored in an internal storage unit, and obtains the current value of the FB signal. The FB signal value table is a table indicating the correspondence of the above difference to a current value (digital value) for canceling out a stationary magnetic field in the magnetic substance core.

The feedback signal adjustment unit 2014 performs D/A (Digital/Analog) conversion on the current value of the FB signal which is supplied from the feedback signal conversion unit 2015, and outputs the generated current as the FB signal to the FB coil. In addition, the feedback signal adjustment unit 2014 outputs the current value of the FB signal, supplied from the feedback signal conversion unit 2015, to the data signal conversion unit 2016. The data signal conversion unit 2016 amplifies a voltage (feedback signal), supplied from the feedback signal adjustment unit 2014, based on an amplification degree which is set in advance, and outputs the amplified voltage as a data signal from the output terminal thereof.

The feedback signal adjustment unit 2014 obtains the intensity of the stationary magnetic field canceled in the magnetic substance core, that is, the intensity of the stationary magnetic field Hex applied to the magnetic element 60, from the current value of the FB signal to be supplied. Here, the feedback signal adjustment unit 2014 reads out the magnetic field intensity corresponding to the current value of the FB signal, from a current value magnetic field table which is previously written and stored in an internal storage unit, and obtains the intensity of the magnetic field which is applied to the magnetic element 60. The current value magnetic field table is a table indicating the correspondence of the above current value of the FB signal to the intensity of the applied stationary magnetic field Hex. As described above, a method of determining the amount of the FB signal through arithmetic operation processing using the FB signal value table has been illustrated. However, since the FB signal is generated by current control, a method of determining the amount of the FB signal based on the reference potential of an operational amplifier or the like which is used in a voltage-current conversion circuit may be used.

When magnetism in the magnetic field proportion type is detected using the above-mentioned time-resolution FG type magnetic element, a measurable magnetic field range is determined by the intensity of the excitation signal and the amount of magnetic field generated per current (hereinafter, referred to as excitation efficiency) applied to the coil which is caused by the material and structure of the magnetic substance core of the magnetic element 60.

On the other hand, when magnetism in the magnetic field balance type is detected using the time-resolution FG type magnetic element, a magnetic field within the magnetic substance core is maintained in an equilibrium state so that the detection signal is output at a constant time interval (T/2) regardless of the stationary magnetic field Hex which is applied to the magnetic element 60. For this reason, a restriction can be performed by the power supply voltage of the entire magnetic element 60, that is, the measurement of the magnetic field can be performed in a range in which the current value of the FS signal is capable of being supplied.

In addition, when magnetism in the magnetic field proportion type is detected using the time-resolution FG type magnetic element, a time interval at which the detection signal is output changes depending on the magnetic field, and thus, the characteristics of the magnetic element 60 is reflected directly in the linearity of magnetic sensitivity.

On the other hand, when magnetism in the magnetic field balance type is detected using the time-resolution FG type magnetic element, the time interval of a positive and negative detection signal and the waveform of a detection signal do not change in a feedback convergence state, and thus the waveform of the detection signal and the stationarity of a time interval at which the detection signal is generated have a tendency to be maintained.

For this reason, when a measuring object is applied to the magnetic element, such as a current sensor, which measures a magnetic field which is generated by a current of approximately several hundred A (amperes) in the entire measurement current range in a state where linearity is maintained, magnetism detection in the magnetic field balance type has been mainly used so far, as compared to the magnetic field proportion type.

Figure 6:
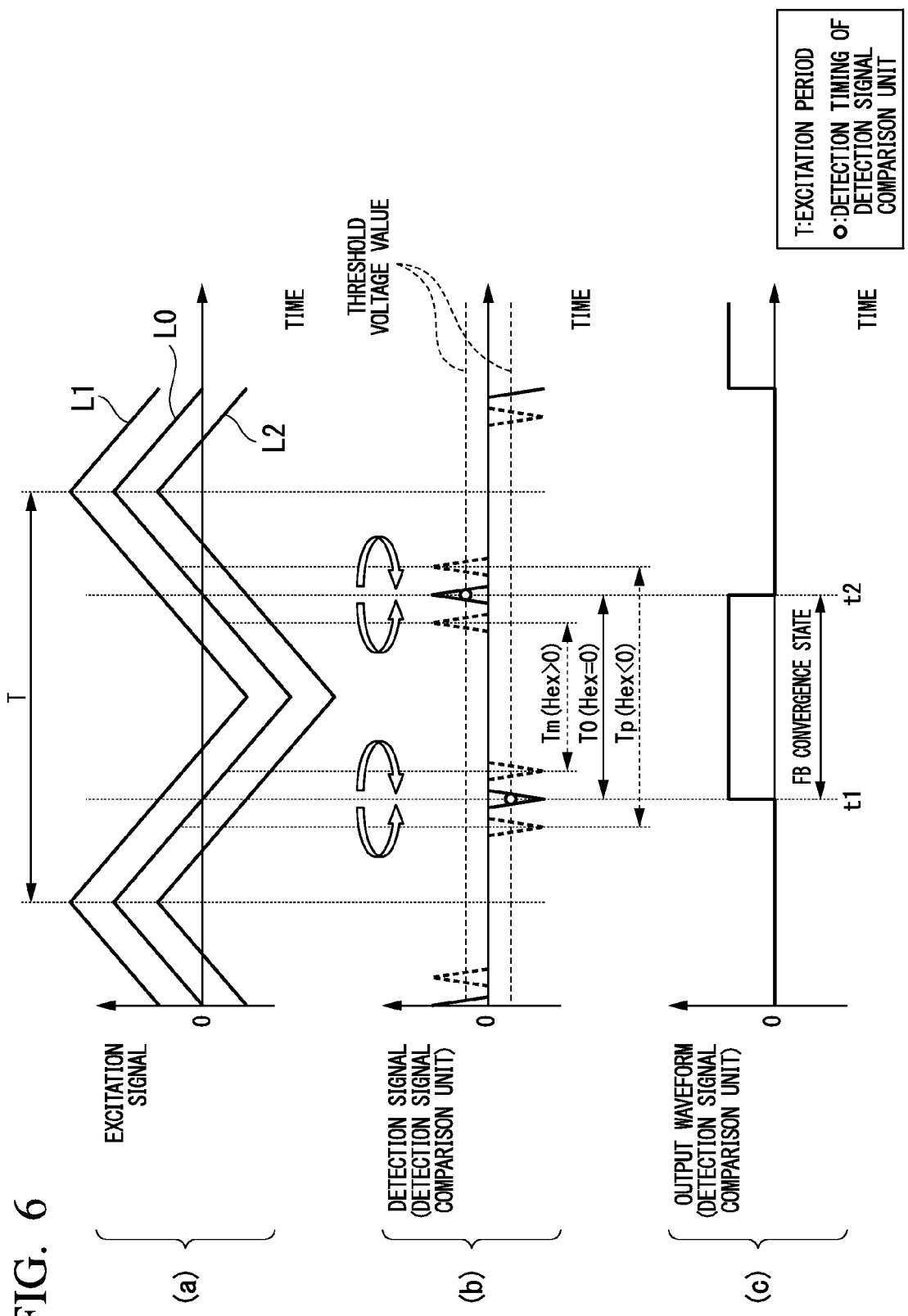
FIG. 6 is a diagram illustrating an output waveform which is output by a detection signal comparison unit 2013 of the magnetic field detector 200 in FIG. 5.

FIG. 6 is a diagram illustrating an output waveform which is output by the detection signal comparison unit 2013 of the magnetic field detector 200 in FIG. 5. Part (a) of FIG. 6 shows an excitation current (excitation signal) which is supplied to the exciting coil 62 of the magnetic element; the vertical axis shows an excitation current, and the horizontal axis shows time. The excitation current is a positive and negative alternating signal bordered by a reference current value of 0 A (zero amperes). Part (b) of FIG. 6 shows a detection signal which is supplied to the detection signal comparison unit 2013; the vertical axis shows a voltage value, and the horizontal axis shows time. Part (c) of FIG. 6 shows an output waveform indicating a time width between time t1 and time t2 which is output by the detection signal comparison unit 2013; the vertical axis shows a voltage level of a "H" level or a "L" level of the output waveform, and the horizontal axis shows time. In part (c) of FIG. 6, the output waveform is a signal of a "H" level from time t1 to time t2, times before and after the time interval are set to be at a "L" level.

Part (a) of FIG. 6 is the same as the excitation signal in FIG. 4, and part (b) of FIG. 6 is the same as the detection signal in FIG. 4. The detection signal in part (b) of FIG. 6 is supplied from the detection signal amplification unit 2012 to the detection signal comparison unit 2013. In addition, part (c) of FIG. 6 shows an output waveform which is generated by the detection signal comparison unit 2013 based on the detection signal, and is supplied to the feedback signal conversion unit 2015. As can be understood from part (c) of FIG. 6, for example, the output waveform which is output by the detection signal comparison unit 2013 shows a time width between time t1 and time t2. The feedback signal conversion unit 2015 obtains a current value of the FB signal which is supplied to the FB coil 64, from this output waveform. In addition, part (c) of FIG. 6 shows an FB convergence state in which feedback is performed, and the output waveform is set to be T/2.

Figure 7:
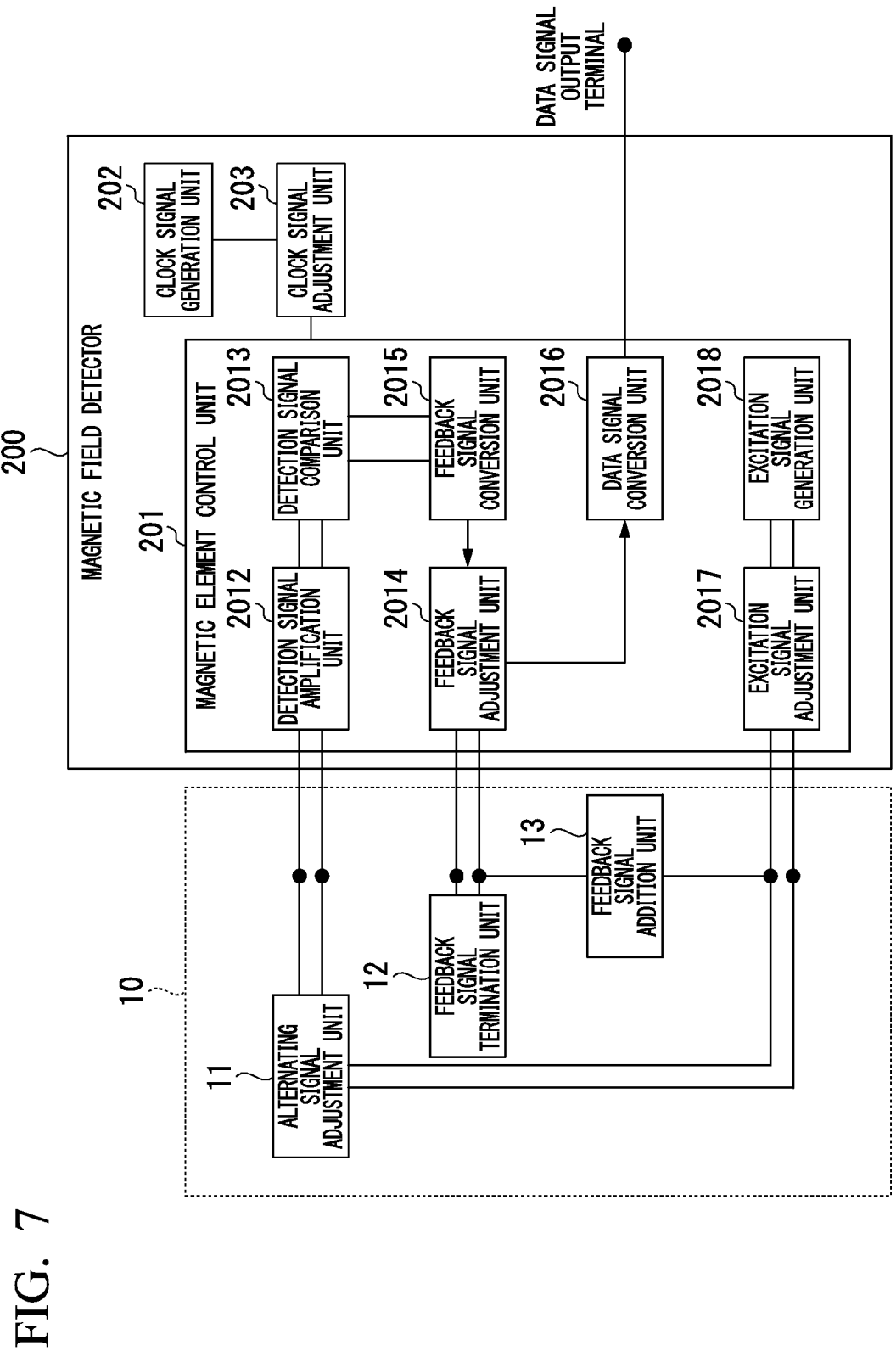
FIG. 7 is a diagram illustrating an outline of inspection of a magnetic field detector using an inspection circuit according to a first embodiment of the present invention.

Next, the first embodiment of the present invention will be described with reference to the drawings. FIG. 7 is a diagram illustrating an outline of inspection of the magnetic field detector using the inspection circuit according to the first embodiment of the present invention. A magnetic field detector 200 of FIG. 7 is the same as the magnetic field detector 200 of FIG. 5. The inspection circuit 10 according to the present embodiment includes an alternating signal adjustment unit 11, a feedback signal termination unit 12 and a feedback signal addition unit 13.

When the excitation signal which is output by the excitation signal adjustment unit 2017 is input, the alternating signal adjustment unit 11 performs voltage-current conversion on the voltage value of the excitation signal, amplifies a current signal of the conversion result to a current value which is set in advance, and outputs the amplified signal, as a pseudo detection signal, to the detection signal amplification unit 2012. Here, the voltage value which is set in advance is a value obtained by an experiment to connect the magnetic element 60 to the magnetic field detector 200 to be inspected and measure the voltage value of the detection signal which is output in actual measurement. The alternating signal adjustment unit 11 is formed so as to measure the current value of the excitation signal which is output by the excitation signal adjustment unit 2017 and to perform a voltage-current conversion and amplification process in which the voltage value of the detection signal having the current value measured is set. For example, the alternating signal adjustment unit 11 may be configured as a resistor having a resistance value which generates a voltage drop for setting the excitation signal (that is, excitation current) to the voltage value of the detection signal.

That is, a configuration is formed in which two input terminals of the detection signal amplification unit 2012 are connected to two outputs of the excitation signal adjustment unit 2017, respectively, by two wirings, and both ends of the resistor are connected to the wirings, respectively. Thereby, the alternating signal adjustment unit 11 outputs the excitation current which is an excitation signal supplied from the excitation signal adjustment unit 2017, as a pseudo detection signal obtained by simulating an actual detection signal, to the detection signal amplification unit 2012.

The feedback signal termination unit 12 terminates an output from the feedback signal adjustment unit 2014, feeds back a feedback signal to the excitation signal adjustment unit 2017, and forms a feedback loop in the magnetic field detector 200. Here, the feedback signal termination unit 12 uses, for example, a resistor having a resistance value which is the same as or similar to that of the FB coil 64 of the magnetic element 60 which is connected to the magnetic field detector 200 to be inspected.

That is, the feedback signal termination unit 12 supplies the feedback signal which is output by the feedback signal adjustment unit 2014, to the excitation signal adjustment unit 2017. Thereby, the excitation signal adjustment unit 2017 superimposes the feedback signal on the excitation signal so that the pseudo detection signal is set to be in an equilibrium state, and then outputs the superimposed signal as an excitation signal which is supplied to the alternating signal adjustment unit 11 in reality.

The feedback signal addition unit 13 adds a predetermined direct current to a current of the feedback signal which is supplied from the feedback signal adjustment unit 2014, and supplies a resultant current of the addition result, as an adjustment feedback signal, to the excitation signal adjustment unit 2017. The numerical value of the predetermined direct current is a current value of a pseudo stationary current for simulating a stationary current which is superimposed on the excitation signal when the stationary magnetic field Hex is applied to the magnetic element 60. In addition, the feedback signal addition unit 13 can linearly change the current value in a range of the current value corresponding to the measurable magnetic field range of the magnetic field detector 200 through control from the outside.

Figure 8:
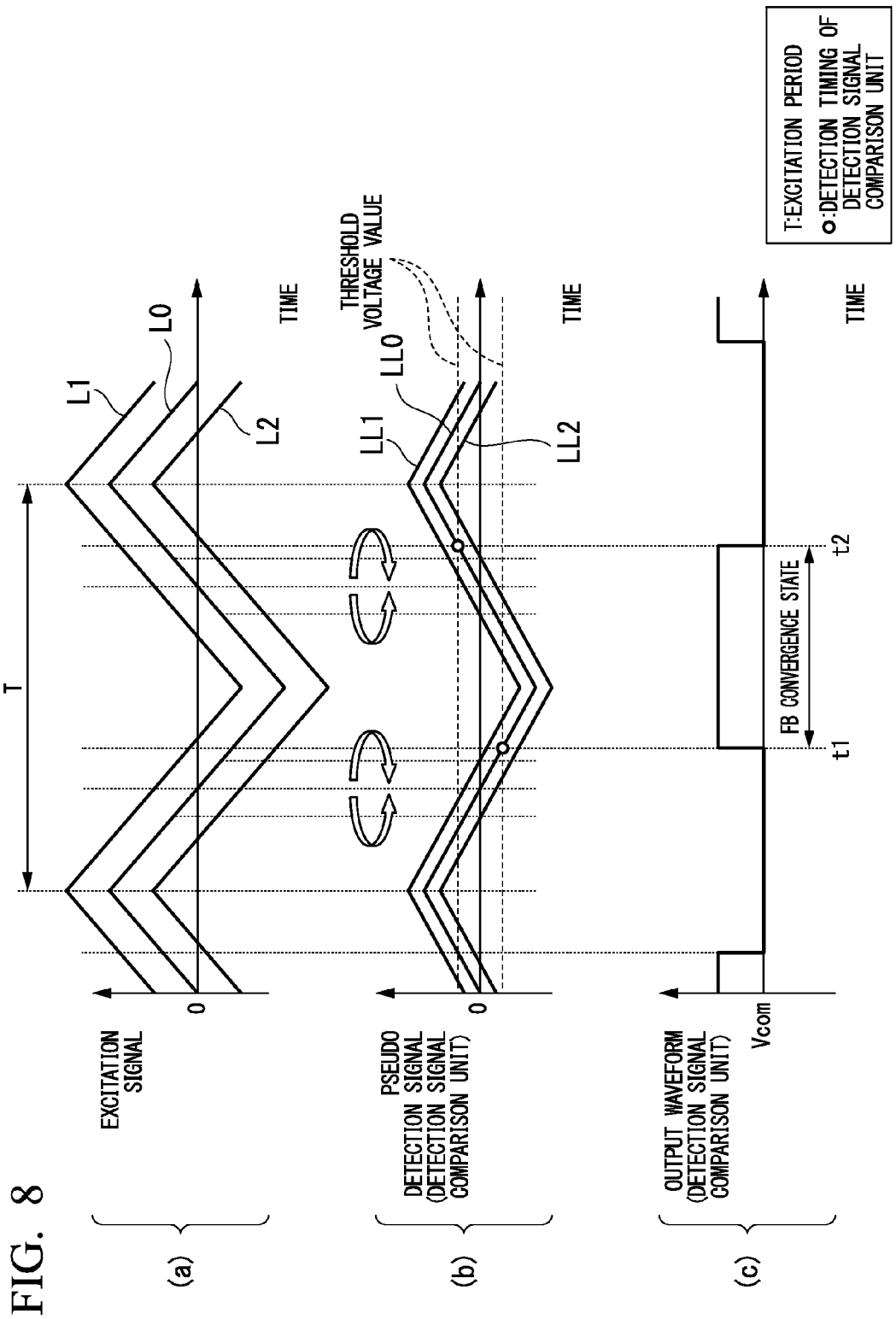
FIG. 8 is a diagram illustrating an alternating signal adjustment unit 11 performing a current-voltage conversion and amplification process on an excitation signal which is supplied from an excitation signal adjustment unit 2017, and outputting the resultant, as a pseudo detection signal, to a detection signal amplification unit 2012.

FIG. 8 is a diagram illustrating the alternating signal adjustment unit 11 performing an amplification process or an attenuation process of the excitation signal which is supplied from the excitation signal adjustment unit 2017, and outputting the resultant, as a pseudo detection signal, to the detection signal amplification unit 2012. Part (a) of FIG. 8 shows an excitation current (excitation signal) which is supplied to the exciting coil 62 of the magnetic element; the vertical axis shows an excitation current, and the horizontal axis shows time. The excitation current is a positive and negative alternating signal bordered by a reference current value of 0 A (zero amperes). Part (b) of FIG. 8 shows a pseudo detection signal which is supplied to the detection signal comparison unit 2013; the vertical axis shows a voltage value, and the horizontal axis shows time. Part (c) of FIG. 8 shows an output waveform indicating a time width between time t1 and time t2 which is output by the detection signal comparison unit 2013; the vertical axis shows a voltage level of a "H" level or a "L" level of the output waveform, and the horizontal axis shows time. In part (c) of FIG. 8, the output waveform is a signal of a "H" level from time t1 to time t2, times before and after the time interval are set to be at a "L" level.

In addition, part (a) of FIG. 8 is the same signal as the excitation signal of part (a) of FIG. 6. Part (b) of FIG. 8 is a diagram illustrating a pseudo detection signal which is generated by performing a current-voltage conversion and amplification process on the excitation signal which is supplied from the excitation signal adjustment unit 2017 by the alternating signal adjustment unit 11. Part (c) of FIG. 8 is a diagram illustrating an output waveform which is generated from the pseudo detection signal by the detection signal comparison unit 2013.

Referring back to FIG. 7, similarly to when the detection signal is supplied, the detection signal comparison unit 2013 compares the voltage value of the detection signal in which the pseudo detection signal is amplified with a threshold voltage value which is set in advance, detects time t1 and time t2, and generates an output waveform of part (b) of FIG. 6 indicating a time width between time t1 and time t2.

A case where the aforementioned inspection circuit 10 is connected and the stationary current is not added by the feedback signal addition unit 13, that is, a case where only the feedback signal is supplied to the excitation signal adjustment unit 2017 is set to be in the same state as that when the magnetic element 60 is connected to the magnetic field detector 200 and is placed in the environment of a zero magnetic field. In this case, when a data signal has a numerical value deviating from an ideal reference value (for example, 0) of the zero magnetic field, this numerical value is an offset component generated by the magnetic element control unit 201 which is an internal circuit of the magnetic field detector 200.

Therefore, it is possible to detect whether an offset value in the magnetic element control unit 201 is within an error range which is set in advance by measuring the data signal in a state where the stationary current is not added, and to perform non-defective product inspection during the shipment or the like of the magnetic field detector 200 which is set to be normal when the offset value is within the error range and which is set to be defective when the offset value is out of the error range.

In addition, a case where the aforementioned inspection circuit 10 is connected and the stationary current is added by the feedback signal addition unit 13, that is, a case where the stationary current corresponding to the stationary magnetic field Flex is added and supplied to the feedback signal is set to be in the same state as that when the magnetic element 60 is connected to the magnetic field detector 200 and is placed in the environment of the stationary magnetic field corresponding to the above stationary current.

The current value of the stationary current is changed in association with the range of measurable magnetic field intensity in the magnetic field detector 200 to be inspected, and the data signal in that case is measured, thereby allowing linearity between the magnetic field intensity and the numerical value of the data signal to be inspected.

That is, by a current or a voltage corresponding to a predetermined stationary magnetic field being added to the feedback signal, a curve L0 (zero magnetic field) shown in part (a) of FIG. 8 changes to a curve L1 or a curve L2 which is any stationary magnetic field, and a curve LL0 (zero magnetic field) of a pseudo detection signal shown in part (b) of FIG. 8 also corresponds to a change in the curve L1 and the curve L2 shown in part (a) of FIG. 8 and changes to a curve LL1 and a curve LL2. Therefore, a current or a voltage corresponding to a predetermined stationary magnetic field is added to the feedback signal, and thus it is possible to generate a pseudo detection signal in a state where the stationary magnetic field is applied.

Therefore, the stationary current is linearly changed by the feedback signal addition unit 13, and the voltage value of the data signal is measured in association with this change, whereby it is possible to accurately determine the data signal changes linearly, or the inclination of a straight line indicating a correspondence relation between the stationary current and the voltage value of the data signal is normalized (whether the magnetic field intensity corresponding to the stationary current is accurately measured).

Figure 9:
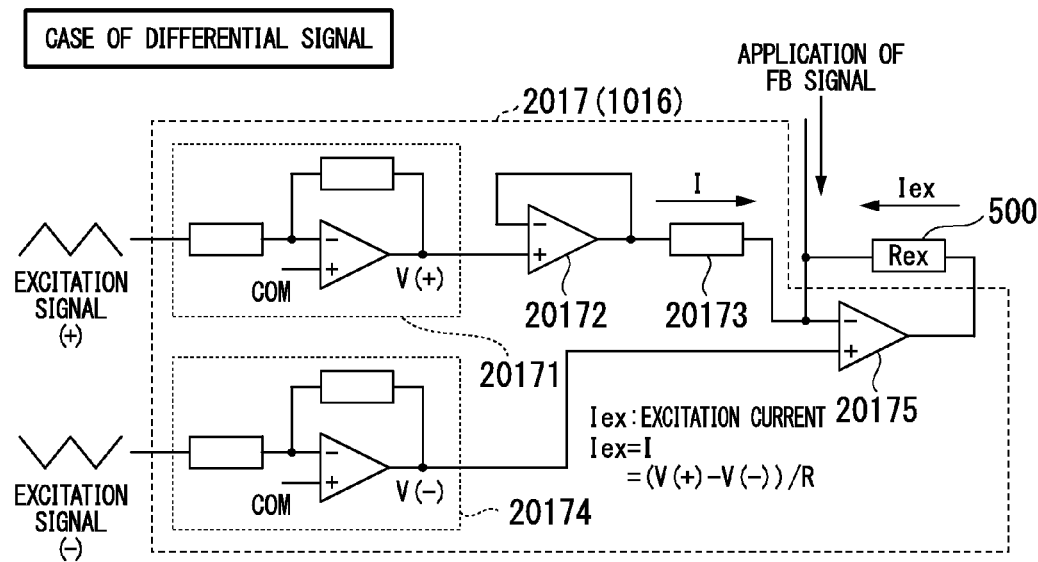
FIG. 9 is a diagram illustrating addition of a feedback (FB) signal based on a current when the excitation signal adjustment unit 2017 of the magnetic field detector 200 generates an excitation signal based on a differential signal from a triangular wave signal which is output by an excitation signal generation unit 2018.

Next, FIG. 9 is a diagram illustrating addition of a feedback (FB) signal based on a current when the excitation signal adjustment unit 2017 of the magnetic field detector 200 generates an excitation signal based on a differential signal from a triangular wave signal which is output by the excitation signal generation unit 2018. In FIG. 9, the excitation signal adjustment unit 2017 generates an excitation signal based on a difference between a triangular wave signal from the excitation signal generation unit 2018 and an inversion signal of the triangular wave signal, and outputs the generated signal from the output terminal thereof.

The excitation signal adjustment unit 2017 includes an amplifier circuit 20171, an inverting circuit 20172, a resistor 20173, an amplifier circuit 20174, and a differential amplifier circuit 20175. A resistor 500 is a resistor corresponding to the exciting coil 62, that is, constituting the alternating signal adjustment unit 11. Here, the resistor 20173 has a resistance value of R. The differential amplifier circuit 20175 performs voltage-current conversion in which an excitation signal of a voltage signal is converted into an excitation signal of a current signal by the resistor 20173.

In a case of the excitation signal adjustment unit 2017 having a circuit configuration shown in FIG. 9, the feedback current of the FB signal (the same is true of a case where the stationary current is added) is supplied to the (−) input terminal of the differential amplifier circuit 20175. Thereby, a feedback loop of the magnetic balance type of the magnetic field detector 200 using the inspection circuit 10 in the present embodiment is formed.

Figure 10:
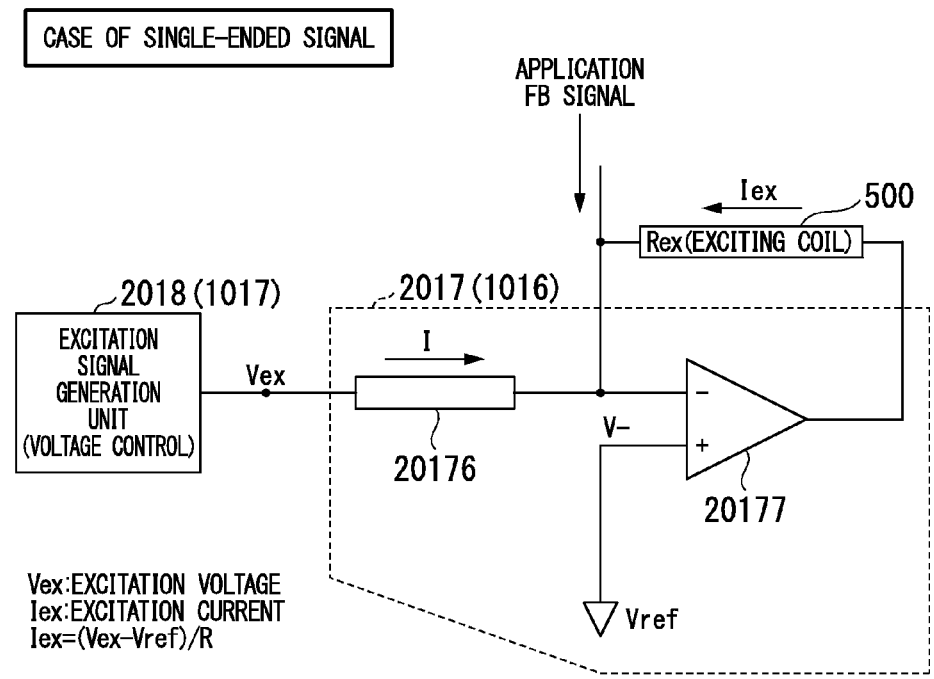
FIG. 10 is a diagram illustrating addition of a feedback (FB) signal based on a current when the excitation signal adjustment unit 2017 of the magnetic field detector 200 generates an excitation signal based on a single-ended signal from a triangular wave signal which is output by the excitation signal generation unit 2018.

Next, FIG. 10 is a diagram illustrating addition of a feedback (FB) signal based on a current when the excitation signal adjustment unit 2017 of the magnetic field detector 200 generates an excitation signal based on a single-ended signal from a triangular wave signal which is output by the excitation signal generation unit 2018. In FIG. 10, similarly to FIG. 9, the excitation signal adjustment unit 2017 generates an excitation signal based on a difference between a triangular wave signal from the excitation signal generation unit 2018 and a reference voltage Vref, and outputs the generated signal from the output terminal thereof.

The excitation signal adjustment unit 2017 includes a resistor 20176 and a differential amplifier circuit 20177. The resistor 500 is a resistor corresponding to the exciting coil 62, that is, constituting the alternating signal adjustment unit 11. Here, the resistor 20176 has a resistance value of R. The differential amplifier circuit 20177 performs voltage-current conversion in which an excitation signal of a voltage signal is converted into an excitation signal of a current signal by the resistor 20176.

In a case of the excitation signal adjustment unit 2017 having a circuit configuration shown in FIG. 10, the FB signal is supplied to the (−) input terminal of the differential amplifier circuit 20177. Thereby, a feedback loop of the magnetic balance type of the magnetic field detector 200 using the inspection circuit 10 in the present embodiment is formed. The resistor 20176 converts the triangular wave signal which is a voltage signal into a triangular wave current signal, and supplies the converted signal to the (−) input terminal of the differential amplifier circuit 20177.

As described above, according to the present embodiment, the inspection circuit 10 is used, and thus the measurement of an offset voltage in the zero magnetic field of the magnetic field detector 200 and linearity of output data for magnetic field intensity in a measurable magnetic field range can be performed easily and with a high level of accuracy without being influenced by a surrounding magnetic field, without using a high-priced magnetic field generator, and without being influenced by the physical characteristics of the magnetic element 60. In addition, according to the present embodiment, since the FB signal is applied to the excitation signal adjustment unit, an FB control system similar to current addition type EX coil FB control is formed. Therefore, this is suitable as a circuit that evaluating the temperature characteristics of an offset output caused by the temperature characteristics of an offset of the excitation signal.

(Second Embodiment)

Figure 11:
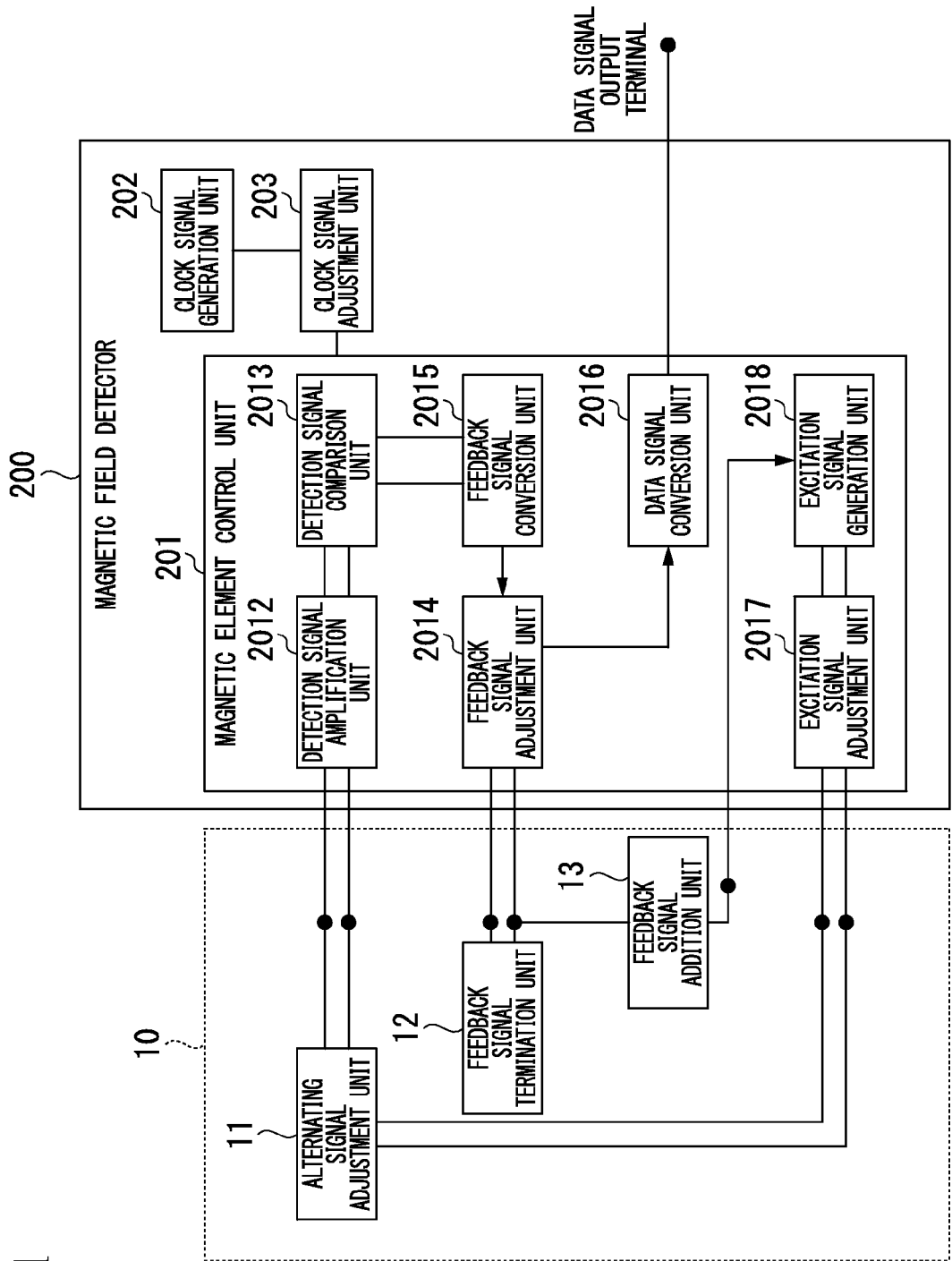
FIG. 11 is a diagram illustrating an outline of inspection of a magnetic field detector using an inspection circuit according to a second embodiment of the present invention.

A second embodiment of the present invention will be described with reference to the drawings. FIG. 11 is a diagram illustrating an outline of inspection of a magnetic field detector using an inspection circuit according to the second embodiment of the present invention. A magnetic field detector 200 in FIG. 11 is the same as the magnetic field detector 200 according to the first embodiment of FIG. 5. An inspection circuit 10 according to the present embodiment includes an alternating signal adjustment unit 11, a feedback signal termination unit 12 and a feedback signal addition unit 13.

Unlike the first embodiment in which the feedback signal from the feedback signal termination unit 12 is supplied to the excitation signal adjustment unit 2017, the second embodiment is configured such that the feedback signal from the feedback signal termination unit 12 is added to the output of the excitation signal generation unit 2018. Other configurations and operations are the same as those in the first embodiment, and thus the description of configurations will not be given.

Figure 12:
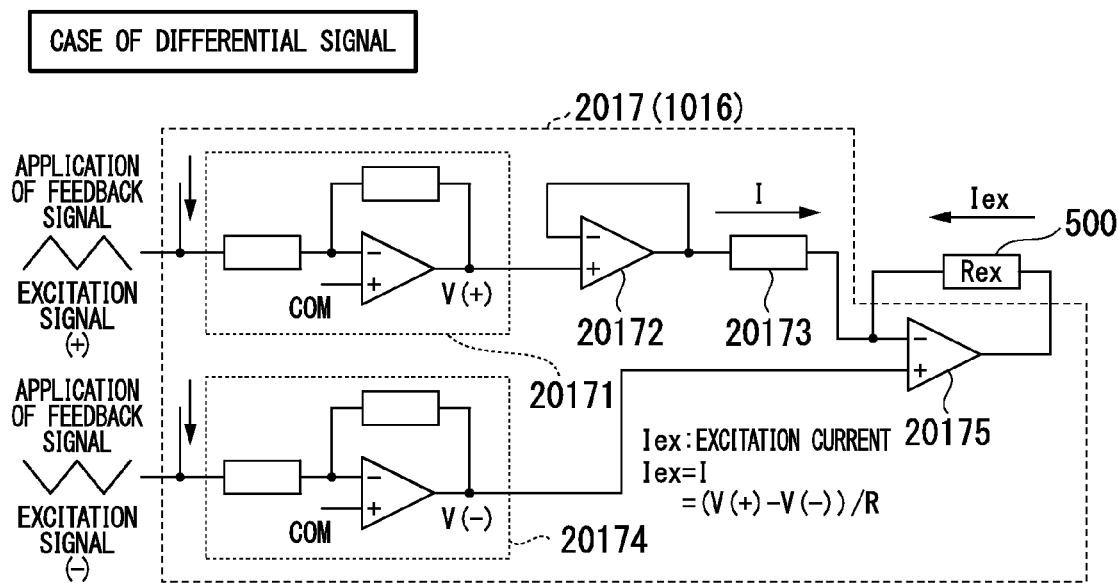
FIG. 12 is a diagram illustrating addition of a feedback (FB) signal based on a voltage when the excitation signal adjustment unit 2017 of the magnetic field detector 200 generates an excitation signal based on a differential signal from a triangular wave signal which is output by the excitation signal generation unit 2018.

FIG. 12 is a diagram illustrating addition of a feedback (FB) signal based on a voltage when the excitation signal adjustment unit 2017 of the magnetic field detector 200 generates an excitation signal based on a differential signal from a triangular wave signal which is output by the excitation signal generation unit 2018. In FIG. 12, the excitation signal adjustment unit 2017 generates an excitation signal based on a difference between a triangular wave signal on which an FB signal from the excitation signal generation unit 2018 is superimposed and an inversion signal of the triangular wave signal, and outputs the generated signal from the output terminal thereof.

The excitation signal adjustment unit 2017 includes an amplifier circuit 20171, an inverting circuit 20172, a resistor 20173, an amplifier circuit 20174, and a differential amplifier circuit 20175. A resistor 500 is a resistor corresponding to the exciting coil 62, that is, constituting the alternating signal adjustment unit 11.

The excitation signal adjustment unit 2017 having a circuit configuration shown in FIG. 12 supplies and adds a feedback voltage of the FB signal (the same is true of a case where a stationary voltage is added) to any or each of the triangular wave signal and the inversion signal of the triangular wave signal. Thereby, a feedback loop of a magnetic balance type of the magnetic field detector 200 using the inspection circuit 10 according to the present embodiment is formed.

With the above-mentioned configuration, as is the case with the first embodiment, the pseudo detection signal shown in part (b) of FIG. 8 can be supplied to the detection signal comparison unit 2013 instead of the detection signal shown in part (b) of FIG. 6. It is possible to obtain the same output waveform shown in part (c) of FIG. 8 as the output waveform shown in part (c) of FIG. 6, and to inspect the characteristics of the magnetic element control unit 201 which is an internal circuit of the magnetic field detector 200.

Figure 13:
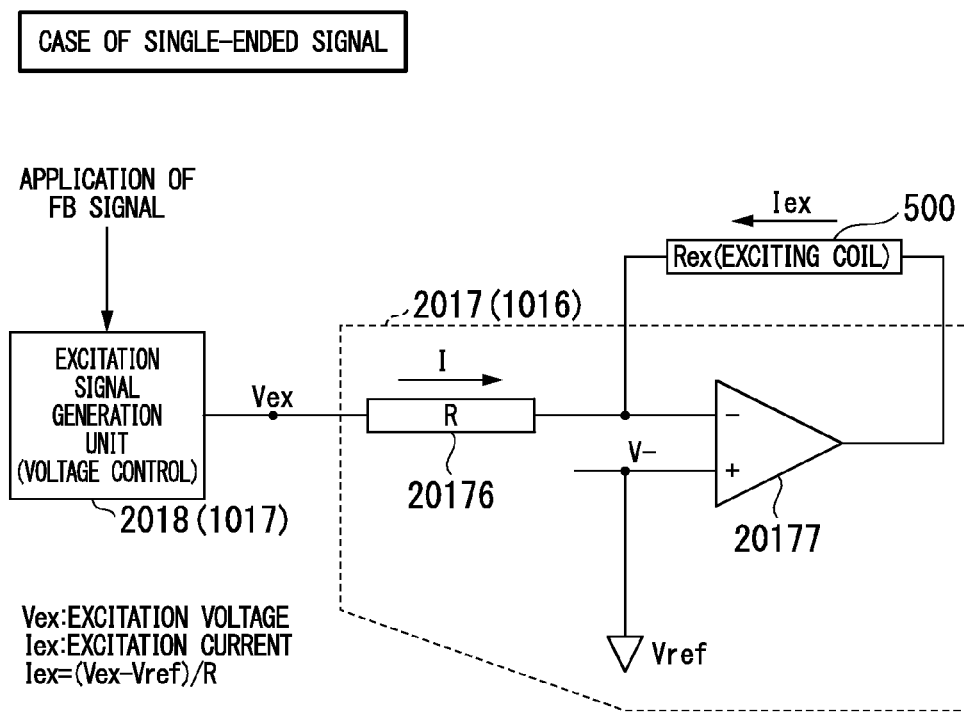
FIG. 13 is a diagram illustrating addition of a feedback (FB) signal based on a current when an excitation signal is generated based on a single-ended signal from a triangular wave signal which is output by the excitation signal generation unit 2018 of the magnetic field detector 200.

Next, FIG. 13 is a diagram illustrating addition of a feedback (FB) signal based on a voltage when an excitation signal is generated based on a single-ended signal from a triangular wave signal which is output by the excitation signal generation unit 2018 of the magnetic field detector 200. In FIG. 13, similarly to FIG. 12, the excitation signal adjustment unit 2017 generates an excitation signal based on a difference between a triangular wave signal on which an FB signal from the excitation signal generation unit 2018 is superimposed and a reference voltage Vref, and outputs the generated signal from the output terminal thereof.

The excitation signal adjustment unit 2017 includes a resistor 20176 and a differential amplifier circuit 20177. The resistor 500 is a resistor corresponding to the exciting coil 62, that is, constituting the alternating signal adjustment unit 11.

The excitation signal adjustment unit 2017 having a circuit configuration shown in FIG. 13 superimposes the FB signal on the triangular wave signal, and supplies the superimposed signal to the (−) input terminal of the differential amplifier circuit 20177 of the excitation signal adjustment unit 2017. Thereby, a feedback loop of a magnetic balance type of the magnetic field detector 200 using the inspection circuit 10 according to the present embodiment is formed. The resistor 20176 converts the triangular wave signal which is a voltage signal into a triangular wave current signal, and supplies the converted signal to the (−) input terminal of the differential amplifier circuit 20177.

As described above, according to the present embodiment, as is the case with the first embodiment, the inspection circuit 10 is used, and thus the measurement of an offset voltage in the zero magnetic field of the magnetic field detector 200 and linearity of output data for magnetic field intensity in a measurable magnetic field range can be performed easily and with a high level of accuracy without being influenced by a surrounding magnetic field, without using a high-priced magnetic field generator, and without being influenced by the physical characteristics of the magnetic element 60. In addition, in the case of the present embodiment, since the FB signal is applied to the excitation signal generation unit, it is possible to suppress an increase in a consumption current with an increase in the amount of the FB signal, as compared to the first embodiment. Meanwhile, it is possible to perform measurement similar to the above even by applying the FB signal instead of Vref to the (+) input terminal of the differential amplifier circuit 20177 of FIG. 13.

(Third Embodiment)

Figure 14:
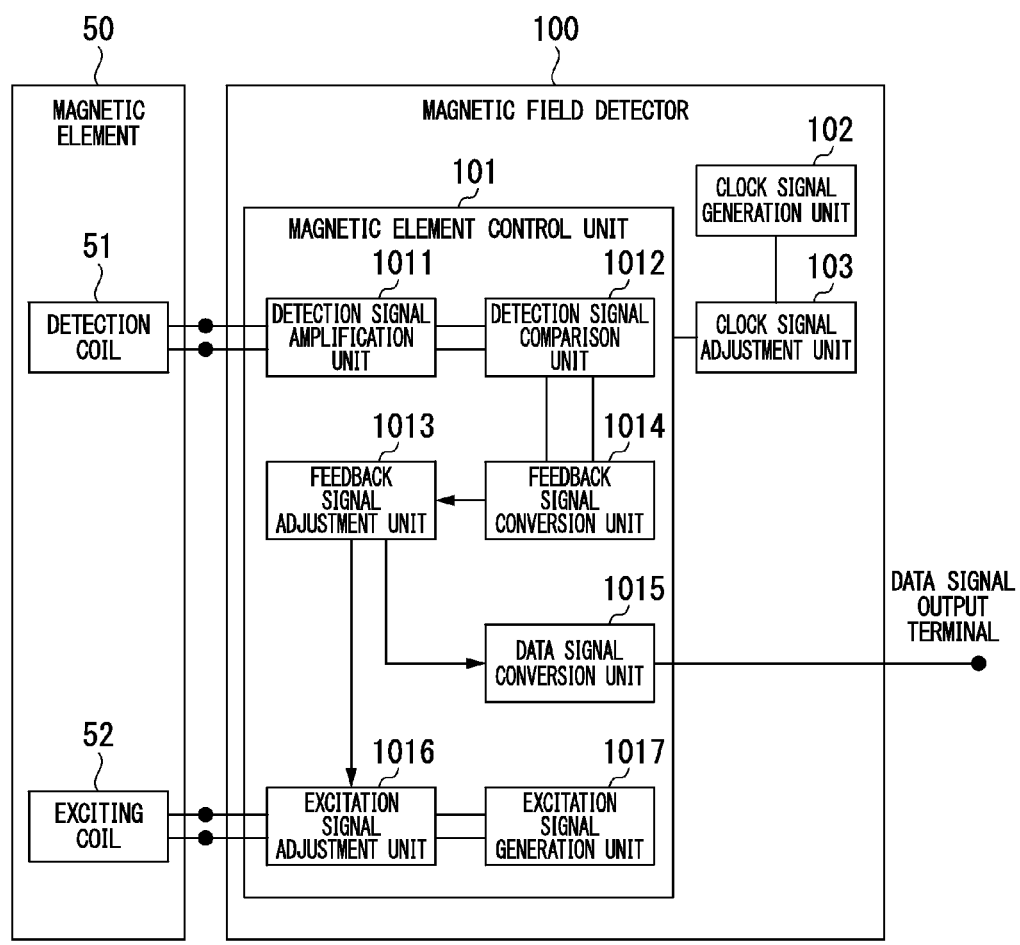
FIG. 14 is a block diagram illustrating a configuration example of a magnetic field detector 100 based on EX coil FB control using the magnetic element 50 of FIG. 1 which serves as an inspection object in which an inspection circuit 20 according to the present embodiment is used.

Hereinafter, a third embodiment of the present invention will be described with reference to the drawings. FIG. 14 is a block diagram illustrating a configuration example of a magnetic field detector 100 based on EX coil FB control using the magnetic element 50 of FIG. 1 which serves as an inspection object in which an inspection circuit 10 described later according to the present embodiment is used.

The magnetic field detector 100 that serves as an inspection object according to the present embodiment controls an excitation signal which is applied to the exciting coil 52 when the intensity of a stationary magnetic field which is applied to the flux-gate type magnetic element 50 constituted by the detection coil 51 and the exciting coil 52 is detected based on a time-resolution magnetic balance type.

The magnetic element control unit 101 includes a detection signal amplification unit 1011, a detection signal comparison unit 1012, a feedback signal adjustment unit 1013, a feedback signal conversion unit 1014, a data signal conversion unit 1015, an excitation signal adjustment unit 1016 and an excitation signal generation unit 1017.

The clock signal generation unit 102 is constituted by an oscillator that generates a clock signal having a predetermined period, and outputs the generated clock signal to the clock signal adjustment unit 103.

The clock signal adjustment unit 103 amplifies the signal level of the clock signal to be supplied, or performs processing such as a change in the period of the clock signal, and outputs the clock signal of the processing result to the excitation signal generation unit 1017.

In the magnetic element control unit 101, the excitation signal generation unit 1017 generates a triangular wave signal as an alternating signal, for example, an alternating voltage signal that alternates using 0 V as a reference potential, based on a clock signal which is supplied from the clock signal adjustment unit 103.

The excitation signal adjustment unit 1016 amplifies the triangular wave signal, generated by the excitation signal generation unit 1017, at a predetermined amplification factor, generates a triangular wave current signal, and applies the generated signal to the exciting coil 52.

In addition, the excitation signal adjustment unit 1016 generates an excitation signal which is a triangular wave current signal applied to the exciting coil 52 by adding a feedback current If (FB signal) to the triangular wave signal.

Referring back to FIG. 14, the detection signal amplification unit 1011 amplifies a voltage between both ends of the detection coil 51 of the magnetic element 50, depending on an amplification degree which is set in advance.

The detection signal comparison unit 1012 compares a voltage value of the amplified detection signal which is supplied from the detection signal amplification unit 1011 with a threshold voltage value which is set in advance, and detects the first detection signal and the second detection signal (detection signal; see part (c) of FIG. 2).

Here, as shown in part (c) of FIG. 2, the first detection signal is a pulse having a negative polarity (negative voltage), and is generated by an induced electromotive force in a voltage region in which the polarity of a current applied to the exciting coil 52 changes from positive (positive current) to negative (negative current). On the other hand, the second detection signal is a pulse having a positive polarity (positive voltage), and is generated by an induced electromotive force in a current region in which the polarity of a current applied to the exciting coil 52 changes from negative (negative current) to positive (positive current).

The feedback signal conversion unit 1014 generates voltage information (information for determining the voltage of a feedback signal described later) corresponding to the difference Td detected by the detection signal comparison unit 1012, and outputs the generated information, as measurement data, to the feedback signal adjustment unit 1013.

The feedback signal adjustment unit 1013 generates a voltage corresponding to the voltage information which is supplied from the feedback signal conversion unit 1014, and supplies the voltage, as a feedback signal, to the excitation signal adjustment unit 1016 and the data signal conversion unit 1015.

The data signal conversion unit 1015 amplifies the voltage (feedback signal) which is supplied from the feedback signal adjustment unit 1013, depending on an amplification degree which is set in advance, and outputs the amplified voltage as a data signal from the output terminal thereof.

In the present embodiment, even when any of a configuration in which digital processing based on an arithmetic operation using a digital value is performed and a configuration in which analog processing based on an arithmetic operation using an analog value is performed is used as a configuration in which the voltage of the feedback signal which is an FB signal is generated, the magnetic field detector 100 can be formed. Hereinafter, a configuration in which the voltage of the feedback signal is generated using digital processing and a configuration in which the feedback voltage is generated using analog processing will be described in order. The following description is true of the first embodiment and the second embodiment.

(Configuration in which Voltage of Feedback Signal is Generated Using Digital Processing)

The detection signal comparison unit 1012 measures a time width from the first detection signal to the second detection signal, obtains a difference Td (=Tw−(T/2)) between this time width Tw (Tp, Tm or the like) and the time of a half of the period T of the triangular wave, that is, T/2, and outputs the resultant to the feedback signal conversion unit 1014.

When the difference Td which is time information is supplied from the detection signal comparison unit 1012, the feedback signal conversion unit 1014 generates voltage information for generating the voltage of the feedback signal as an FB signal from the difference Td.

Here, a time-voltage information table indicating the correspondence of the difference Td to voltage information of a digital value corresponding to the difference Td is previously written and stored in an internal storage unit of the feedback signal conversion unit 1014.

The feedback signal conversion unit 1014 reads out voltage information corresponding to the supplied difference Td from the time-voltage information table which is stored in the internal storage unit, and outputs the resultant to the feedback signal adjustment unit 1013. For example, the voltage information is data of a digital value indicating the voltage value of the feedback signal. In addition, the voltage information is given the polarity of the difference Td, that is, has a positive polarity when the difference Td is positive, and has a negative polarity when the difference Td is negative. Therefore, when the stationary magnetic field Hex having a positive polarity is applied to the magnetic element 50, the excitation signal adjustment unit 1016 superimposes the feedback current If having a negative polarity, as a feedback signal, on a drive current I which is generated from the triangular wave voltage signal. On the other hand, when the stationary magnetic field Hex having a negative polarity is applied thereto, the excitation signal adjustment unit superimposes the feedback current If having a positive polarity, as a feedback signal, on the drive current I which is generated from the triangular wave voltage signal.

The feedback signal adjustment unit 1013 generates a feedback signal of a voltage value indicating the voltage information based on the voltage information which is supplied from the feedback signal conversion unit 1014, and outputs the generated signal, as an FB signal, to the excitation signal adjustment unit 1016.

Here, since the voltage information is a digital value, the feedback signal adjustment unit 1013 includes, for example, a D/A converter therein, inputs the voltage information which is a supplied digital value to the D/A converter to thereby obtain a direct-current voltage, and outputs the resultant, as a feedback signal, to the excitation signal adjustment unit 1016.

The excitation signal adjustment unit 1016 superimposes the feedback current If generated from the feedback signal which is an FB signal supplied from the feedback signal adjustment unit 1013 and an offset current Ia supplied from the adjustment signal generation unit 1100, on the drive current I generated therein from the triangular wave voltage signal, and applies the resultant, as the triangular wave current signal, to the exciting coil 52.

In addition, when the feedback current If is superimposed on the triangular wave current signal (excitation current), a time interval between the first detection signal and the second detection signal which are detected by the detection signal comparison unit 1012 is located in the vicinity of T/2.

For this reason, when the detection signal comparison unit 1012 has already superimposed the feedback current If on the triangular wave current signal, the output time information shows a current value of a difference between the feedback current If required for being set to T/2 and the feedback current If which is presently applied. Therefore, when an excitation signal is applied, the detection signal comparison unit 1012 outputs the difference Td, as the time information indicating the above-mentioned current value of the difference, to the feedback signal conversion unit 1014.

In addition, when the difference Td which is the time information indicating the current value of the difference is supplied, as previously stated, the feedback signal conversion unit 1014 reads out the voltage information for generating the current value corresponding to the difference Td from the time-voltage information table which is stored in the internal storage unit, and outputs the resultant to the feedback signal adjustment unit 1013.

In addition, the feedback signal adjustment unit 1013 includes a storage unit therein, integrates and stores voltage information in the storage unit, generates a voltage of the feedback signal, output to the excitation signal adjustment unit 1016, using the integrated voltage information, and outputs the generated voltage to the excitation signal adjustment unit 1016.

Here, the feedback signal adjustment unit 1013 determines whether the voltage information corresponding to the difference Td is included in a set voltage range which is set in advance.

When the voltage information is not included in the set voltage range and a stationary magnetic field which is applied to the magnetic element 50 is canceled, the feedback signal adjustment unit 1013 determines the information as a voltage of which the magnetic field does not change even by the application, that is, which has no influence on the cancellation.

That is, the feedback signal adjustment unit 1013 determines that the time width between the first detection signal and the second detection signal is substantially T/2 due to an error of control accuracy when changing a magnetic field intensity. In this case, the feedback signal adjustment unit 1013 discards voltage information falling within this error range without integrating the voltage information in the time information until just before the internal storage unit.

The data signal conversion unit 1015 amplifies the voltage information which is supplied from the feedback signal adjustment unit 1013, depending on an amplification degree which is set in advance, and outputs the resultant to the outside.

The amplification degree in the data signal conversion unit 1015 is set to a value by which only a range of the voltage value of the feedback signal in a range capable of being linearly measured in advance is output as a data signal. That is, according to the amplification degree, only a range in which a magnetic field that cancels out a stationary magnetic field and a feedback signal having a voltage value for generating the magnetic field maintain linearity corresponds to an amplified voltage, and a voltage falling outside of the range is saturated and is set to a constant voltage. That is, the data signal conversion unit 1015 amplifies and outputs a feedback signal based on an amplification factor, which is set in advance, for saturating a voltage value of a feedback signal falling outside of the voltage range of the feedback signal in which the voltage value of the feedback signal and the magnetic field intensity generated by the voltage value have linearity.

Therefore, the data signal indicates a magnetic field voltage for obtaining the intensity of a magnetic field that cancels out a stationary magnetic field, that is, the intensity of a stationary magnetic field. A magnetic field intensity detector (not shown) located at the outside converts the voltage value of the magnetic field voltage indicated by the data signal into the intensity of a magnetic field, and outputs the converted intensity of a magnetic field.

Here, a magnetic field intensity table indicating the correspondence of the voltage value of the magnetic field voltage to the intensity of a magnetic field corresponding to the voltage value of the magnetic field voltage is previously written and stored in an internal storage unit of the magnetic field intensity detector.

The magnetic field intensity detector reads out the magnetic field intensity corresponding to the voltage value of the magnetic field voltage indicated by the data signal, supplied from the magnetic field detector 100, from the magnetic field intensity table, and displays the resultant, as a numerical value of the intensity of the stationary magnetic field (Hex), for example, on a display unit provided in the magnetic field intensity detector. In the present invention, the magnetism detector is constituted by the magnetic field detector 100 and the above-mentioned magnetic field intensity detector which is not shown.

(Configuration in which Voltage of Feedback Signal is Generated Using Analog Processing)

The detection signal comparison unit 1012 detects a rising portion of the first detection signal and a rising portion of the second detection signal which are outputs of the detection signal amplification unit, and outputs the resultant to the feedback signal conversion unit 1014.

The feedback signal conversion unit 1014 generates a pulse having a duty ratio as voltage information based on a period (interval between time t1 and time t2, that is, time width) in which the first detection signal and the second detection signal are output, and outputs the pulse as voltage information to the feedback signal adjustment unit 1013.

That is, the feedback signal conversion unit 1014 obtains a duty ratio indicating the voltage value of the feedback signal, as the voltage information, from the above-mentioned time width, and outputs a square wave of the duty ratio indicating the voltage value of the feedback signal to the feedback signal adjustment unit 1013.

When the information is indicated by a square wave signal, the feedback signal adjustment unit 1013 generates a direct-current voltage corresponding to the duty ratio using a PWM (Pulse Width Modulation) circuit or the like, and outputs the generated voltage as a feedback signal.

For example, when the time width from the first detection signal to the second detection signal is longer than the time width from the second detection signal to the first detection signal, a stationary magnetic field is required to be negative. For this reason, the feedback signal adjustment unit 1013 generates a feedback signal of a direct-current voltage for generating a positive magnetic field by which the stationary magnetic field is canceled.

On the other hand, when the time width from the second detection signal to the first detection signal is longer than the time width from the first detection signal to the second detection signal, the stationary magnetic field is positive, and thus the feedback signal adjustment unit 1013 generates a feedback signal of a direct-current voltage for generating a negative magnetic field by which the stationary magnetic field is canceled.

That is, when a pulse which is voltage information is supplied, the feedback signal adjustment unit 1013 generates a feedback signal of a voltage value corresponding to the duty ratio of the pulse, and outputs the generated feedback signal to the excitation signal adjustment unit 1016.

Here, the excitation signal adjustment unit 1016 has a configuration of FIG. 9 or 10, similarly to the excitation signal adjustment unit 2017 described previously in the first embodiment.

In a case of FIG. 9, the excitation signal adjustment unit 1016 includes the amplifier circuit 20171, the inverting circuit 20172, the resistor 20173, the amplifier circuit 20174, and the differential amplifier circuit 20175. A resistor 500 is a resistor corresponding to the exciting coil 62, that is, constituting an alternating signal adjustment unit 21. The excitation signal adjustment unit 1016 generates an excitation signal based on a difference between a triangular wave signal from the excitation signal generation unit 2018 and an inversion signal of the triangular wave signal, and outputs the generated signal from the output terminal thereof to the exciting coil 62.

On the other hand, in a case of FIG. 10, the excitation signal adjustment unit 1016 includes a resistor 20176 and a differential amplifier circuit 20177. The resistor 500 is a resistor corresponding to the exciting coil 62, that is, constituting the alternating signal adjustment unit 11. In addition, the excitation signal adjustment unit 1016 generates an excitation signal based on a difference between a triangular wave signal from the excitation signal generation unit 1017 and a reference voltage Vref, and outputs the generated signal from the output terminal thereof to the exciting coil 62.

As described above, the feedback current If which is supplied to the excitation signal adjustment unit 1026 has a proportional relation to an external magnetic field (stationary magnetic field Hex). The feedback current If corresponding to the feedback signal is superimposed on the drive current I (triangular wave current signal), and the superimposed current is applied to the exciting coil 62. Thereby, a magnetic field based on the feedback current If is generated, and a magnetic field which is applied to a magnetic substance core within the magnetic element 50 is adjusted so as to be constant (so that the time width between the first detection signal and the second detection signal is constant at T/2). As a result, it is possible to hold the time interval between the first detection signal and the second detection signal constant without depending on an external stationary magnetic field.

Similarly to the case of digital processing, the excitation signal adjustment unit 1016 superimposes the feedback signal supplied from the feedback signal adjustment unit 1013 on the triangular wave voltage signal generated in the inside of the control circuit, and applies the triangular wave voltage signal on which the feedback signal is superimposed, as an excitation signal, to the exciting coil 52.

The operations of the data signal conversion unit 1015 are the same as those in the digital processing except for the amplification of an analog value, and thus the description thereof will not be given.

Figure 15:
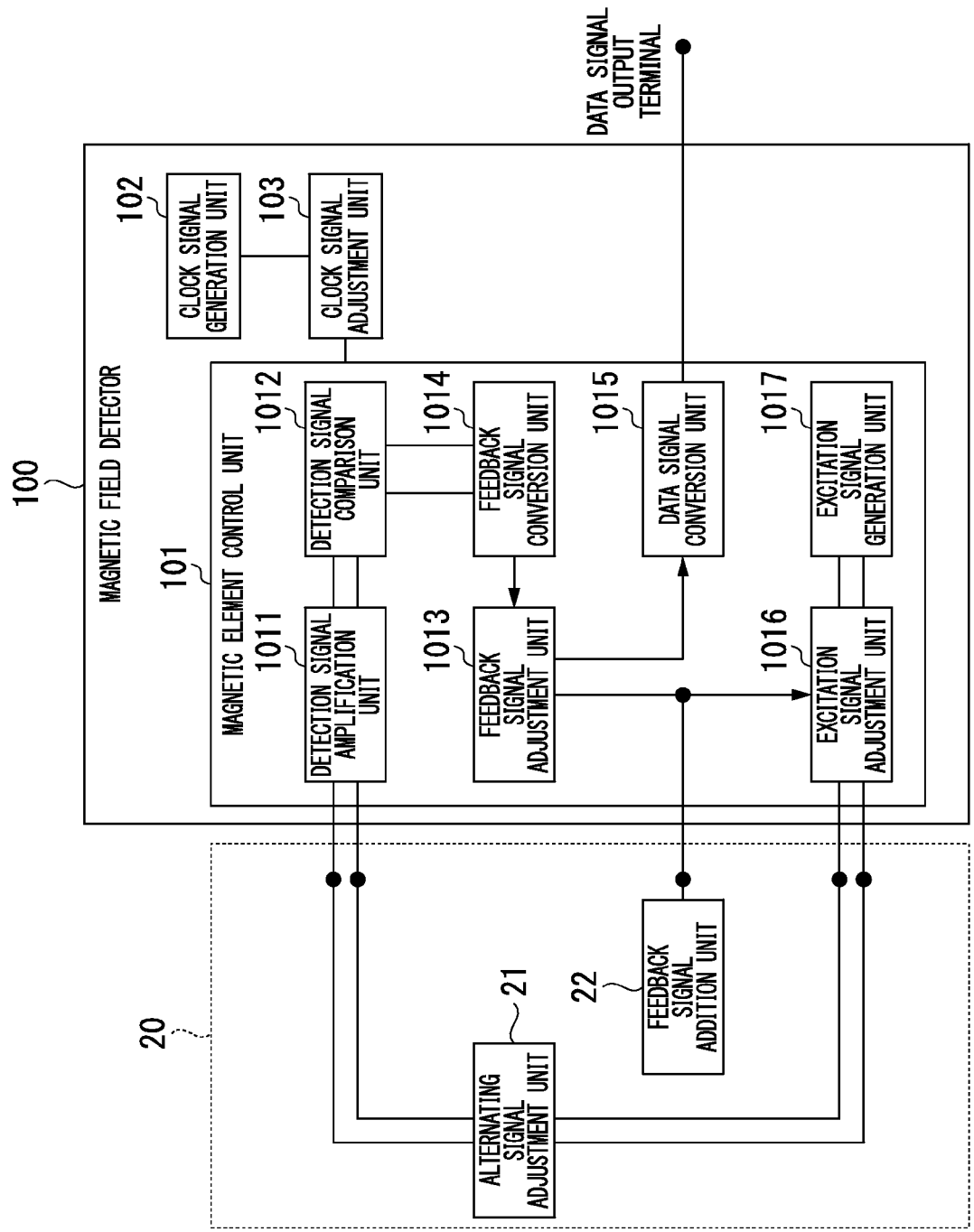
FIG. 15 is a diagram illustrating an outline of inspection of a magnetic field detector using an inspection circuit according to a third embodiment of the present invention.

Next, the third embodiment of the present invention will be described with reference to the drawings. FIG. 15 is a diagram illustrating an outline of inspection of a magnetic field detector using an inspection circuit according to the third embodiment of the present invention. A magnetic field detector 100 of FIG. 15 is the same as the magnetic field detector 100 of FIG. 14. An inspection circuit 20 according to the present embodiment includes an alternating signal adjustment unit 21 and a feedback signal addition unit 22.

Similarly to the alternating signal adjustment unit 11 of the first embodiment, when the excitation signal which is output by the excitation signal adjustment unit 1016 is input, the alternating signal adjustment unit 21 performs current-voltage conversion on the current value of the excitation signal, amplifies the voltage signal of the conversion result to a voltage value which is set in advance, and outputs the resultant, as a pseudo detection signal, to the detection signal amplification unit 1011. Here, the voltage value which is set in advance is a value obtained by an experiment to connect the magnetic element 50 to the magnetic field detector 100 to be inspected and measure the voltage value of the detection signal which is output in actual measurement. The alternating signal adjustment unit 21 is formed so as to measure the current value of the excitation signal which is output by the excitation signal adjustment unit 1016 and to perform a voltage-current conversion and amplification process in which the voltage value of the detection signal having the current value measured is set. For example, the alternating signal adjustment unit 21 may be configured as a resistor having a resistance value which generates a voltage drop for setting the excitation signal (that is, excitation current) to the voltage value of the detection signal.

That is, a configuration is formed in which two input terminals of the detection signal amplification unit 1011 are connected to two outputs of the excitation signal adjustment unit 1016, respectively, by two wirings, and both ends of the resistor are connected to the wirings, respectively. Thereby, the alternating signal adjustment unit 21 outputs the excitation current which is an excitation signal supplied from the excitation signal adjustment unit 1016, as a pseudo detection signal obtained by simulating an actual detection signal, to the detection signal amplification unit 1011.

The feedback signal addition unit 22 adds a predetermined direct current to a current of the feedback signal which is supplied from the feedback signal adjustment unit 1013, and supplies a resultant current of the addition result, as an adjustment feedback signal, to the excitation signal adjustment unit 1016. As is the case with the first embodiment, the numerical value of the predetermined direct current is a current value of a pseudo stationary current for simulating a stationary current which is superimposed on the excitation signal when the stationary magnetic field Hex is applied to the magnetic element 50. In addition, the feedback signal addition unit 22 can linearly change the current value in a range of the current value corresponding to the measurable magnetic field range of the magnetic field detector 100 through control from the outside.

With the above-mentioned configuration, as described previously in the first embodiment, the pseudo detection signal shown in part (b) of FIG. 8 is supplied to the detection signal amplification unit 1011, and the output waveform indicating a time width between time t1 and time t2 shown in part (c) of FIG. 8 is output from the detection signal comparison unit 1012 to the feedback signal conversion unit 1014.

In the case of the third embodiment, since a feedback loop is formed inside the magnetic element control unit 101 which is an internal circuit of the magnetic field detector 100, unlike the first embodiment and the second embodiment, it is not necessary to provide a configuration corresponding to the feedback signal termination unit 12.

A case where the aforementioned inspection circuit 20 is connected and the stationary current is not added by the feedback signal addition unit 22, that is, a case where only the feedback signal is supplied to the excitation signal adjustment unit 1016 is set to be the same state as that when the magnetic element 50 is connected to the magnetic field detector 100 and is placed in the environment of a zero magnetic field. In this case, as is the case with the first embodiment, when a data signal has a numerical value deviating from an ideal reference value (for example, 0) of the zero magnetic field, this numerical value is an offset component generated by the magnetic element control unit 101 which is an internal circuit of the magnetic field detector 100.

Therefore, it is possible to detect whether an offset value in the magnetic element control unit 101 is within an error range which is set in advance by measuring the data signal in a state where the stationary current is not added, and to perform non-defective product inspection during the shipment or the like of the magnetic field detector 100 which is set to be normal when the offset value is within the error range and which is set to be defective when the offset value is out of the error range.

In addition, a case where the aforementioned inspection circuit 20 is connected and the stationary current is added by the feedback signal addition unit 22, that is, a case where the stationary current corresponding to the stationary magnetic field Hex is added and supplied to the feedback signal is set to be in the same state as that when the magnetic element 50 is connected to the magnetic field detector 100 and is placed in the environment of the stationary magnetic field corresponding to the above stationary current.

As is the case with the first embodiment, the current value of the stationary current is changed in association with the range of measurable magnetic field intensity in the magnetic field detector 100 to be inspected, and the data signal in that case is measured, thereby allowing linearity between the magnetic field intensity and the numerical value of the data signal to be inspected.

Therefore, the stationary current is linearly changed by the feedback signal addition unit 22, and the voltage value of the data signal is measured in association with this change, whereby it is possible to accurately determine the data signal changes linearly, or the inclination of a straight line indicating a correspondence relation between the stationary current and the voltage value of the data signal is normalized (whether the magnetic field intensity corresponding to the stationary current is accurately measured).

That is, with the above-mentioned configuration, as is the case with the first embodiment, the pseudo detection signal shown in part (b) of FIG. 8 can be supplied to the detection signal comparison unit 1012 instead of the detection signal shown in part (b) of FIG. 6. It is possible to obtain the same output waveform, shown in part (c) of FIG. 8, which is output by the detection signal comparison unit 1012, as the output waveform shown in part (c) of FIG. 6, and to inspect the characteristics of the magnetic element control unit 101 which is an internal circuit of the magnetic field detector 100.

Next, as is the case with the first embodiment, a case will be described in which a feedback (FB) signal is added based on a current when the excitation signal adjustment unit 1016 of the magnetic field detector 100 generates an excitation signal based on a triangular wave signal from the excitation signal generation unit 1017 shown in FIG. 9. In FIG. 9, the excitation signal adjustment unit 1016 generates an excitation signal based on a difference between a triangular wave signal from the excitation signal generation unit 1017 and an inversion signal of the triangular wave signal, and outputs the generated signal from the output terminal thereof.

As is the case with the first embodiment, the excitation signal adjustment unit 1016 includes an amplifier circuit 20171, an inverting circuit 20172, a resistor 20173, an amplifier circuit 20174, and a differential amplifier circuit 20175. A resistor 500 is a resistor corresponding to the exciting coil 52, that is, constituting the alternating signal adjustment unit 21.

In a case of the excitation signal adjustment unit 2017 having a circuit configuration shown in FIG. 9, the FB signal is supplied to the (−) input terminal of the differential amplifier circuit 20175.

Next, as is the case with the first embodiment, a case will be described in which a feedback (FB) signal is added based on a current when the excitation signal adjustment unit 1016 of the magnetic field detector 100 generates an excitation signal based on a triangular wave signal from the excitation signal generation unit 1017 shown in FIG. 10. In FIG. 10, similarly to FIG. 9, the excitation signal adjustment unit 1016 generates an excitation signal based on a difference between a triangular wave signal from the excitation signal generation unit 1017 and a reference voltage Vref, and outputs the generated signal from the output terminal thereof.

The excitation signal adjustment unit 1016 includes a resistor 20176 and a differential amplifier circuit 20177. A resistor 500 is a resistor corresponding to the exciting coil 62, that is, constituting an alternating signal adjustment unit 21.

In a case of the excitation signal adjustment unit 1016 having a circuit configuration shown in FIG. 10, the feedback current of the FB signal (the same is true of a case where the stationary current is added) is supplied to the (−) input terminal of the differential amplifier circuit 20177. The resistor 20176 converts the triangular wave signal which is a voltage signal into a triangular wave current signal, and supplies the converted signal to the (−) input terminal of the differential amplifier circuit 20177.

As described above, according to the present embodiment, as is the case with the first embodiment, the above inspection circuit is used, and thus the measurement of an offset voltage in the zero magnetic field of the magnetic field detector 100 and linearity of output data for magnetic field intensity in a measurable magnetic field range can be performed easily and with a high level of accuracy without being influenced by a surrounding magnetic field, without using a high-priced magnetic field generator, and without being influenced by the physical characteristics of the magnetic element 50. According to the present embodiment, since the FB signal is applied to the excitation signal adjustment unit from the feedback signal adjustment unit within the control circuit, the FB signal is not included in a signal which is input from an external feedback signal addition unit of the control circuit to the control circuit. Therefore, this is suitable for the linearity evaluation of output data, as compared to the first and second embodiments.

(Fourth Embodiment)

Figure 16:
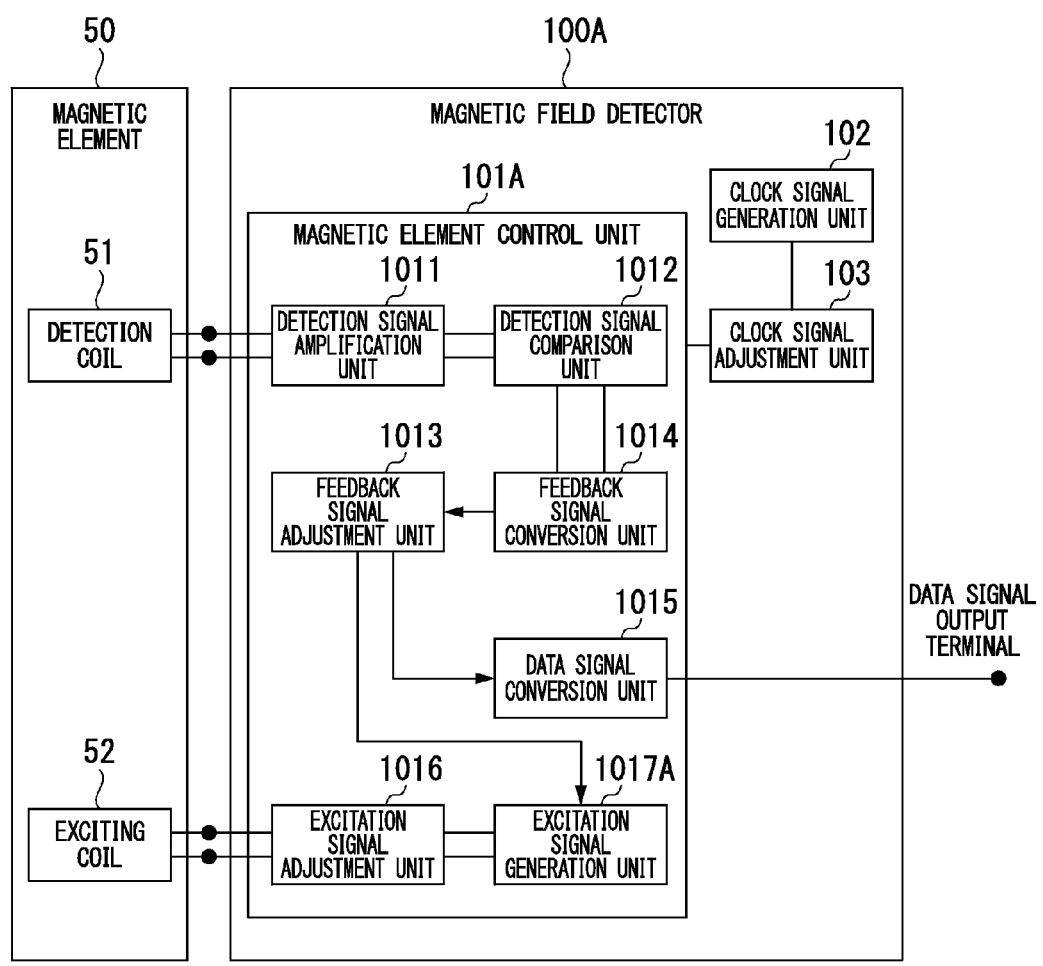
FIG. 16 is a diagram illustrating a configuration example of a magnetic field detector which serves as an inspection object using an inspection circuit 20 according to a fourth embodiment.

A fourth embodiment of the present invention will be described with reference to the drawings. FIG. 16 is a diagram illustrating a configuration example of a magnetic field detector that serves as an inspection object using an inspection circuit 20 according to the fourth embodiment. Unlike the magnetic field detector 100 of the magnetic element control unit 101 in the third embodiment, a magnetic field detector 100A that serves as an inspection object shown in FIG. 16 is configured such that, in a magnetic element control unit 101A, the feedback signal adjustment unit 1013 outputs a feedback signal, as a voltage signal, to an excitation signal generation unit 1017A. Since other configurations are the same as those in the third embodiment, the same components are denoted by the same reference numerals and signs, and the description thereof will not be given.

Figure 17:
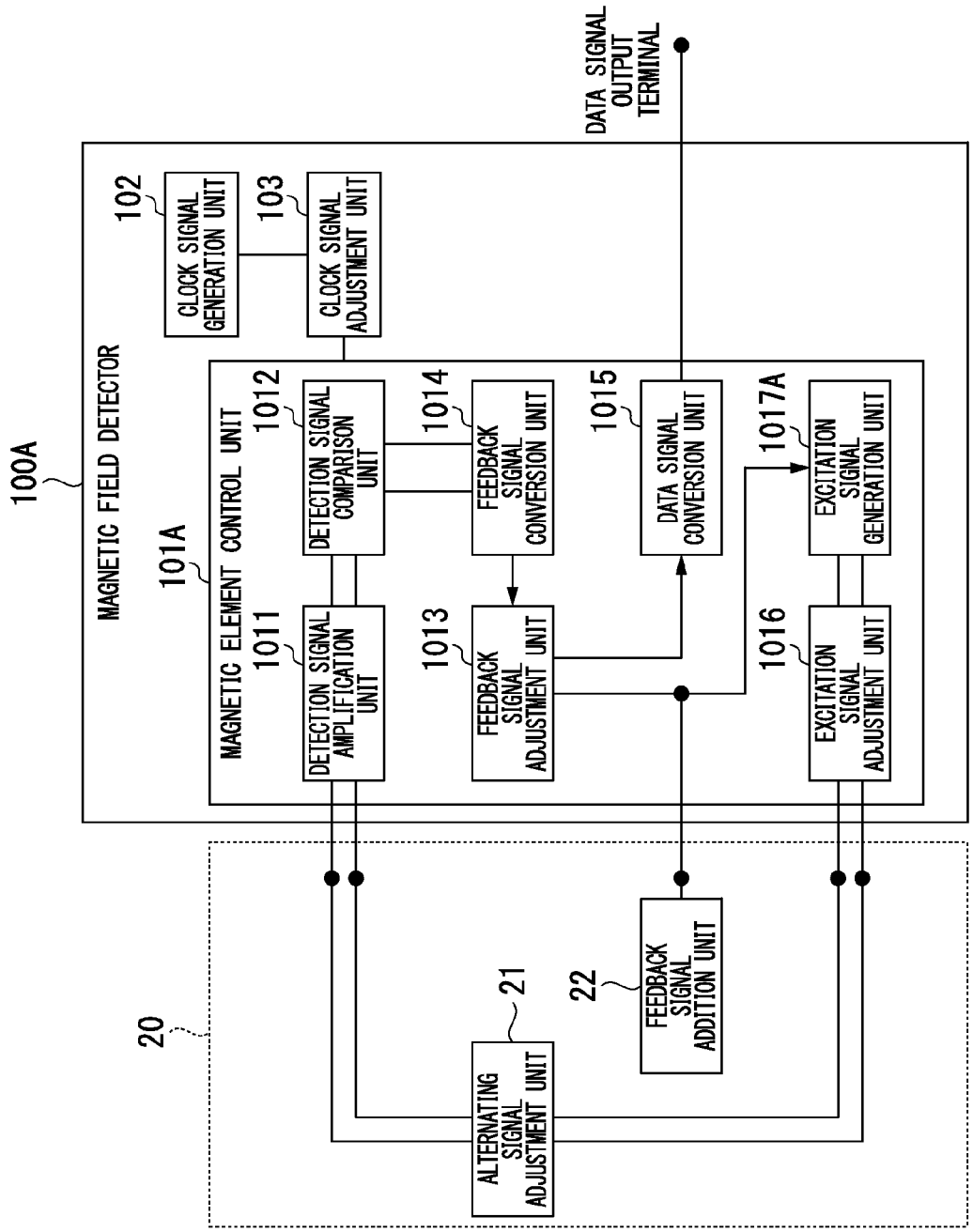
FIG. 17 is a diagram illustrating an outline of inspection of the magnetic field detector using the inspection circuit according to the fourth embodiment of the present invention.

FIG. 17 is a diagram illustrating an outline of inspection of a magnetic field detector using an inspection circuit according to the fourth embodiment of the present invention. The magnetic field detector 100A in FIG. 17 is the same as the magnetic field detector 100A shown in FIG. 16. As described in the third embodiment, the inspection circuit 20 according to the present embodiment includes an alternating signal adjustment unit 21 and a feedback signal addition unit 22.

Unlike the third embodiment in which a feedback signal from the feedback signal adjustment unit 1013 is supplied to the excitation signal adjustment unit 1016, the fourth embodiment is configured such that a feedback signal from the feedback signal adjustment unit 1013 is added to the output of the excitation signal generation unit 1017, as a voltage signal. Other configurations and operations are the same as those in the third embodiment, and thus the description of configurations will not be given.

Next, as is the case with the second embodiment, a case will be described in which a feedback (FB) signal is added based on a voltage when the excitation signal adjustment unit 1016 of the magnetic field detector 100A generates an excitation signal based on a triangular wave signal from the excitation signal generation unit 1017 shown in FIG. 12. In FIG. 12, the excitation signal adjustment unit 1016 generates an excitation signal based on a difference between a triangular wave signal on which an FB signal from the excitation signal generation unit 1017 is superimposed and an inversion signal of the triangular wave signal, and outputs the generated signal from the output terminal thereof.

The excitation signal adjustment unit 1016 includes an amplifier circuit 20171, an inverting circuit 20172, a resistor 20173, an amplifier circuit 20174, and a differential amplifier circuit 20175. A resistor 500 is a resistor corresponding to the exciting coil 52, that is, constituting the alternating signal adjustment unit 21.

In a case of the excitation signal adjustment unit 2017 having a circuit configuration shown in FIG. 12, a feedback voltage of the FB signal (the same is true of a case where a stationary voltage is added) is supplied and added to any or each of the triangular wave signal and the inversion signal of the triangular wave signal.

That is, with the above-mentioned configuration, as is the case with the first embodiment, the pseudo detection signal shown in part (b) of FIG. 8 can be supplied to the detection signal comparison unit 1012 instead of the detection signal shown in part (b) of FIG. 6. It is possible to obtain the same output waveform, shown in part (c) of FIG. 8, which is output by the detection signal comparison unit 1012, as the output waveform shown in part (c) of FIG. 6, and to inspect the characteristics of the magnetic element control unit 101A which is an internal circuit of the magnetic field detector 100A.

Next, as is the case with the second embodiment, a case will be described in which a feedback signal is added based on a voltage when the feedback signal is generated from a triangular wave signal which is generated by the excitation signal generation unit 1017A of the magnetic field detector 100A. In FIG. 13, similarly to FIG. 12, the excitation signal adjustment unit 1016 generates an excitation signal based on a difference between a triangular wave signal on which an FB signal from the excitation signal generation unit 1017A is superimposed and a reference voltage Vref, and outputs the generated signal from the output terminal thereof.

The excitation signal adjustment unit 2017 includes a resistor 20176 and a differential amplifier circuit 20177. A resistor 500 is a resistor corresponding to the exciting coil 52, that is, constituting the alternating signal adjustment unit 21. In addition, according to the present embodiment, unlike the third embodiment, the FB signal is applied to the excitation signal generation unit, and thus it is possible to suppress an increase in a consumption current with an increase in the amount of the FB signal, as compared to the third embodiment.

The excitation signal adjustment unit 2017 having a circuit configuration shown in FIG. 13 superimposes the FB signal on the triangular wave signal, and supplies the superimposed signal to the (−) input terminal of the differential amplifier circuit 20177 of the excitation signal adjustment unit 2017. Thereby, a feedback loop of a magnetic balance type of the magnetic field detector 200 using the inspection circuit 10 according to the present embodiment is formed. The resistor 20176 converts the triangular wave signal which is a voltage signal into a triangular wave current signal, and supplies the converted signal to the (−) input terminal of the differential amplifier circuit 20177.

As described above, according to the present embodiment, as is the case with the third embodiment, the inspection circuit 20 is used, and thus the measurement of an offset voltage in a zero magnetic field of the magnetic field detector 101A and linearity between the magnetic field intensity of a stationary magnetic field in a measurable magnetic field range and the voltage of output data to be output can be performed easily and with a high level of accuracy without being influenced by a surrounding magnetic field, without using a high-priced magnetic field generator, and without being influenced by the physical characteristics of the magnetic element 50. In addition, according to the present embodiment, unlike the third embodiment, the FB signal is applied to the excitation signal generation unit, and thus it is possible to suppress an increase in a consumption current with an increase in the amount of the FB signal, as compared to the third embodiment. Meanwhile, as is the case with the second embodiment, it is possible to perform measurement similar to the above even by applying the FB signal instead of Vref to the (+) input terminal of the differential amplifier circuit 20177 of FIG. 13.

Incidentally, in the first embodiment and the second embodiment, a method has been described in which both the FB signal and any signal are simultaneously applied to the excitation signal adjustment unit or the excitation signal generation unit, as the output signal of the feedback signal addition unit, but a method may be used in which the FB signal is applied to the excitation signal adjustment unit, and any signal is applied to the excitation signal generation unit. In addition, a method may be used in which the FB signal is applied to the excitation signal generation unit, and any signal is applied to the excitation signal adjustment unit. In addition, the third embodiment and the fourth embodiment are the same as the first embodiment and the second embodiment described above. In addition, in the first embodiment to the fourth embodiment, inspection circuit and inspection methods have been described which are used in the inspection of an offset of the output signal in a zero magnetic field and linearity for a change in a magnetic field in a detectable range in a specification, but it is also possible to evaluate the behavior of the output signal when a magnetic field greater than that in a detectable range is applied. Further, any alternating-current signal is applied instead of the stationary current or the stationary voltage converted into the FB signal which is shown in the first embodiment to the fourth embodiment, and thus it is also possible to realize inspection for simulating responsiveness to an external magnetic field of an alternating-current component.

While preferred embodiments of the present invention have been described and illustrated above, these are exemplary of the invention and are not considered as being limited. Additions, omissions, substitutions, and other modifications can be made without departing from the scope of the present invention. That is, the present invention is not limited by the foregoing embodiments, and is intended to be limited by the appended claims.

INDUSTRIAL APPLICABILITY

The present invention can be applied widely to an inspection circuit for a magnetic field detector and an inspection method for the same, and can inspect the characteristics of an internal circuit of a magnetic field detector without using a magnetic field generator and without reflecting the influence of characteristics for a physical property of a magnetic element when the inspection of an offset of an output signal in a zero magnetic field and linearity for a change of a magnetic field in a detectable range in a specification is performed on a magnetic field detector.

REFERENCE SIGNS LIST 10, 20: inspection circuit
11, 21: alternating signal adjustment unit
12: feedback signal termination unit
13, 22: feedback signal addition unit
50, 60: magnetic element
51, 61: detection coil
52, 62: exciting coil
53, 63: magnetic substance core
64: feedback coil
100, 100A, 200: magnetic field detector
101, 101A, 201: magnetic element control unit
102, 202: clock signal generation unit
103, 203: clock signal adjustment unit
500, 20173, 20174, 20176: resistor
1011, 2012: detection signal amplification unit
1012, 2013: detection signal comparison unit
1013, 2014: feedback signal adjustment unit
1014, 2015: feedback signal conversion unit
1015, 2016: data signal conversion unit
1016, 2017: excitation signal adjustment unit
1017, 2018: excitation signal generation unit
20171, 20174: amplifier circuit
20172: inverting circuit
20175, 20177: differential amplifier circuit

The invention claimed is:

1. An inspection circuit, which serves as a pseudo circuit of a flux-gate type magnetic element having an exciting coil and a detection coil, for inspecting a magnetic field detector that detects a magnetic field based on an output of the magnetic element when detecting an intensity of a stationary magnetic field applied to the magnetic element based on a time-resolution magnetic balance type,
wherein the magnetic field detector includes:
an excitation signal generation unit that generates an alternating signal;
a detection signal comparison unit that detects detection signals of a positive voltage or a negative voltage which are generated in the detection coil by an induced electromotive force when a current direction of an excitation current which is applied to the exciting coil is switched;
a feedback signal conversion unit that converts a time width between the detection signals of a positive voltage and a negative voltage into voltage information;
a feedback signal adjustment unit that generates a feedback signal for generating a magnetic field that cancels out the stationary magnetic field which is applied to the magnetic element from the voltage information;
a data signal conversion unit that outputs the feedback signal as a data signal indicating a magnetic field intensity; and
an excitation signal adjustment unit that generates an alternating current from the alternating signal, and generates the excitation current which is applied to the exciting coil based on the alternating current, and the inspection circuit includes:
an alternating signal adjustment unit, connected to an output of the excitation signal adjustment unit, which inputs the excitation current, as a pseudo signal of the detection signal, to an input terminal of the detection signal comparison unit after an intensity of the excitation current which is output by the excitation signal adjustment unit is adjusted.

2. The inspection circuit for a magnetic field detector according to claim 1, wherein the alternating signal adjustment unit is constituted by a first resistor having the same resistance value as that of the exciting coil.

3. The inspection circuit for a magnetic field detector according to claim 2, wherein the inspection circuit further includes:
a feedback signal addition unit that adds a constant current obtained by simulating the stationary magnetic field to the feedback signal and outputs the constant current to the excitation signal adjustment unit.

4. The inspection circuit for a magnetic field detector according to claim 2, wherein the inspection circuit further includes:
a feedback signal addition unit that adds a constant voltage obtained by simulating the stationary magnetic field to the feedback signal and outputs the constant voltage to the excitation signal generation unit.

5. The inspection circuit for a magnetic field detector according to claim 1, wherein the excitation signal adjustment unit generates an excitation signal which is applied to the exciting coil by superimposing the feedback signal, based on the detection signal or the pseudo signal, on the alternating current generated from the alternating signal.

6. The inspection circuit for a magnetic field detector according to claim 5, wherein the inspection circuit further includes:
a feedback signal addition unit that adds a constant current obtained by simulating the stationary magnetic field to the feedback signal and outputs the constant current to the excitation signal adjustment unit.

7. The inspection circuit for a magnetic field detector according to claim 5, wherein the inspection circuit further includes:
a feedback signal addition unit that adds a constant voltage obtained by simulating the stationary magnetic field to the feedback signal and outputs the constant voltage to the excitation signal generation unit.

8. The inspection circuit for a magnetic field detector according to claim 1,
wherein the feedback signal adjustment unit includes:
a terminal for generating, from the voltage information, the feedback signal for generating the magnetic field that cancels out the stationary magnetic field which is applied to the magnetic element, and inputting the feedback signal to the feedback coil, and the inspection circuit further includes:
a feedback signal termination unit that terminates an output of the feedback signal adjustment unit.

9. The inspection circuit for a magnetic field detector according to claim 8, wherein the feedback signal termination unit is constituted by a second resistor having the same resistance value as that of the feedback coil.

10. The inspection circuit for a magnetic field detector according to claim 9, wherein the inspection circuit further includes:
a feedback signal addition unit that adds a constant current obtained by simulating the stationary magnetic field to the feedback signal and outputs the constant current to the excitation signal adjustment unit.

11. The inspection circuit for a magnetic field detector according to claim 9, wherein the inspection circuit further includes:
a feedback signal addition unit that adds a constant voltage obtained by simulating the stationary magnetic field to the feedback signal and outputs the constant voltage to the excitation signal generation unit.

12. The inspection circuit for a magnetic field detector according to claim 8, wherein the inspection circuit further includes:
a feedback signal addition unit that adds a constant current obtained by simulating the stationary magnetic field to the feedback signal and outputs the constant current to the excitation signal adjustment unit.

13. The inspection circuit for a magnetic field detector according to claim 8, wherein the inspection circuit further includes:
a feedback signal addition unit that adds a constant voltage obtained by simulating the stationary magnetic field to the feedback signal and outputs the constant voltage to the excitation signal generation unit.

14. The inspection circuit for a magnetic field detector according to claim 1, wherein the inspection circuit further includes:
a feedback signal addition unit that adds a constant current obtained by simulating the stationary magnetic field to the feedback signal and outputs the constant current to the excitation signal adjustment unit.

15. The inspection circuit for a magnetic field detector according to claim 1, wherein the inspection circuit further includes:
a feedback signal addition unit that adds a constant voltage obtained by simulating the stationary magnetic field to the feedback signal and outputs the constant voltage to the excitation signal generation unit.

16. An inspection method, which uses a pseudo circuit of a flux-gate type magnetic element having an exciting coil and a detection coil, for inspecting a magnetic field detector that detects a magnetic field based on an output of the magnetic element when detecting an intensity of a stationary magnetic field applied to the magnetic element based on a time-resolution magnetic balance type, wherein the magnetic field detector includes:
an excitation signal generation unit that generates an alternating signal;
a detection signal comparison unit that detects detection signals of a positive voltage or a negative voltage which are generated in the detection coil by an induced electromotive force when a current direction of an excitation current which is applied to the exciting coil is switched;
a feedback signal conversion unit that converts a time width between the detection signals of a positive voltage and a negative voltage into voltage information;
a feedback signal adjustment unit that generates a feedback signal for generating a magnetic field that cancels out the stationary magnetic field which is applied to the magnetic element from the voltage information;
a data signal conversion unit that outputs the feedback signal as a data signal indicating a magnetic field intensity; and
an excitation signal adjustment unit that generates an alternating current from the alternating signal, and generates the excitation current which is applied to the exciting coil based on the alternating current, and the inspection method includes:
a step of supplying the excitation current which is output by the excitation signal adjustment unit, to an alternating signal adjustment unit connected to an output of the excitation signal adjustment unit; and
a step of inputting the excitation current, as a pseudo signal of the detection signal, to an input terminal of the detection signal comparison unit after an intensity of the excitation current is adjusted by the alternating signal adjustment unit.

* * * * *